(12) United States Patent
Kang et al.

(10) Patent No.: US 9,960,288 B2
(45) Date of Patent: May 1, 2018

(54) SOLAR RADIATION CONTROL AND ENERGY HARVESTING FILM

(71) Applicant: The United States of America as represented by the Administrator of the National Aeronautics and Space Administration, Washington, DC (US)

(72) Inventors: Jin Ho Kang, Newport News, VA (US); Chase Taylor, Lincoln, NE (US); Cheol Park, Yorktown, VA (US); Godfrey Sauti, Hampton, VA (US); Luke Gibbons, Williamsburg, VA (US); Iseley Marshall, Papillion, NE (US); Sharon E. Lowther, Hampton, VA (US); Peter T. Lillehei, Yorktown, VA (US); Joycelyn S. Harrison, Hampton, VA (US); Robert G. Bryant, Poquoson, VA (US)

(73) Assignee: The United State of America as represented by the Administrator of NASA, Washington, DC (US)

( * ) Notice: Subject to any disclaimer, the term of this patent is extended or adjusted under 35 U.S.C. 154(b) by 227 days.

(21) Appl. No.: 13/962,784

(22) Filed: Aug. 8, 2013

(65) Prior Publication Data
US 2014/0041705 A1  Feb. 13, 2014

Related U.S. Application Data
(60) Provisional application No. 61/681,324, filed on Aug. 9, 2012.

(51) Int. Cl.
*H01L 35/02* (2006.01)
*H01L 31/02* (2006.01)
(Continued)

(52) U.S. Cl.
CPC ........ *H01L 31/02168* (2013.01); *F24J 2/485* (2013.01); *H01L 31/052* (2013.01);
(Continued)

(58) Field of Classification Search
CPC . H01L 31/02168; H01L 31/052; H01L 35/28; H01L 35/30
(Continued)

(56) References Cited

U.S. PATENT DOCUMENTS 8,791,358 B1 * 7/2014 Dutta ................ H01L 31/02021
136/252
2005/0077601 A1 * 4/2005 Yu ......................... H01L 51/529
257/675
(Continued)

FOREIGN PATENT DOCUMENTS

JP  2009141079  6/2009
WO  2008/063474 A2  5/2008

OTHER PUBLICATIONS

Avasthi et al., Synthesis of Metal-Polymer Nanocomposite for Optical Applications, Nanotechnology, pp. 1-4 (2007).*
(Continued)

*Primary Examiner* — Jayne L Mershon
(74) *Attorney, Agent, or Firm* — Jennifer L. Riley; Robin W. Edwards; Mark P. Dvorscak

(57) ABSTRACT

Some implementations provide a device (e.g., solar panel) that includes an active layer and a solar absorbance layer. The active layer includes a first N-type layer and a first P-type layer. The solar absorbance layer is coupled to a first surface of the active layer. The solar absorbance layer includes a polymer composite. In some implementations, the polymer composite includes one of at least metal salts and/or carbon nanotubes. In some implementations, the active layer is configured to provide the photovoltaic effect. In some
(Continued)

implementations, the active layer further includes a second N-type layer and a second P-type layer. In some implementations, the active layer is configured to provide the thermoelectric effect. In some implementations, the device further includes a cooling layer coupled to a second surface of the active layer. In some implementations, the cooling layer includes one of at least zinc oxides, indium oxides, and/or carbon nanotubes.

30 Claims, 12 Drawing Sheets

(51) Int. Cl.
  *H01L 31/0216* (2014.01)
  *H01L 31/052* (2014.01)
  *H01L 35/28* (2006.01)
  *F24J 2/48* (2006.01)
  *H01L 35/30* (2006.01)

(52) U.S. Cl.
  CPC .............. *H01L 35/28* (2013.01); *H01L 35/30* (2013.01); *Y02E 10/40* (2013.01)

(58) Field of Classification Search
  USPC ................................................. 136/205, 246
  See application file for complete search history.

(56) References Cited

U.S. PATENT DOCUMENTS

| | | | |
|---|---|---|---|
| 2005/0092464 A1 | 5/2005 | Leu et al. | |
| 2009/0126783 A1* | 5/2009 | Lin | B82Y 20/00 136/252 |
| 2010/0212711 A1 | 8/2010 | Liu et al. | |
| 2010/0326486 A1 | 12/2010 | Beck et al. | |
| 2011/0017295 A1 | 1/2011 | Yu et al. | |
| 2011/0315207 A1* | 12/2011 | Krajewski | H01L 31/02167 136/256 |
| 2012/0160290 A1* | 6/2012 | Chen | F24J 2/32 136/206 |
| 2012/0312343 A1* | 12/2012 | VanVechten | H01L 35/22 136/201 |
| 2013/0118579 A1* | 5/2013 | Konishi | H01L 31/022425 136/256 |

OTHER PUBLICATIONS

Li et al., Nanocomposites of polymer and inorganic nanoparticles for optical and magnetic applications, Nano Reviews, pp. 1-19 (2010).*
The Institution of Electrical Engineers, Stevenage, GB; 2012, Kang J H et al: "Nanostructured Solar Irradiation Control Materials for Solar Energy Conversion", XP002719157, Database accession No. 13615514 abstract & Next Generation (Nano) Photonic and Cell Technologies for Solar Energy Conversion III Aug. 12-14, 2012 San Diego, CA, USA, vol. 8471, Aug. 12, 2012, Proceedings of the SPIE—The International Society for Optical Engineering USA ISSN: 0277-786X, DOI: 10.1117/12.930485 & Jin Ho Kang et al. Park C et al: "Polymer-Single Wall Carbon Nanotube Composites for Potential Spacecraft Applications", Materials Research Society Syposiun Proceedings, [Materials Research Society Symposium Proceedings], Materials Research Society, Pittsburg, PA; US, vol. 706, Nov. 26, 2002, pp. 91-96, XP009016747, ISBN: 978-1-55899-828-5.

* cited by examiner $$\varepsilon_T = 1 - \rho_T - \tau_T$$

SOLAR RADIATION CONTROL AND ENERGY HARVESTING FILM

CROSS REFERENCE TO RELATED APPLICATION

The present application claims priority to U.S. Provisional Application No. 61/681,324 titled "Solar Radiation Control and Energy Harvesting Film", filed Aug. 9, 2013, which is hereby expressly incorporated by reference herein.

STATEMENT REGARDING FEDERALLY SPONSORED RESEARCH

The invention described herein was made in the performance of work under a NASA cooperative agreement and by employees of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the cooperative agreement recipient elected to retain title.

BACKGROUND

Field

Various features relate to solar radiation control and energy harvesting film.

Background

Over the past few decades, solar energy has attracted keen attention because it is a unique, clean, and sustainable energy resource. It is also widely utilized as a power source in a space exploration There are two feasible approaches in utilizing solar energy, (1) photo-electrical (photovoltaic) conversion, and (2) thermoelectric (TE) conversion. The photovoltaic (PV) conversion is a method of generating an electrical voltage (i.e., electrical power) by converting solar radiation into direct current electricity using semiconductors that exhibit a photovoltaic effect. Typically, photovoltaic power generation uses solar panels composed of a number of solar cells containing photovoltaic material. The thermoelectric (TE) conversion is a method of generating an electrical voltage (i.e., electrical power) based on a spatial temperature differences. Specifically, a thermoelectric device may generate an electrical voltage based on the temperature difference on two separate sides of the thermoelectric device.

Despite the many advances related to solar energy/power generation, there are drawbacks and limitations to current solar energy and/or power generating methods and devices. For example, numerous inorganic energy harvesting materials have been developed to increase the efficiency at which electrical power can be generated from solar energy. However, these inorganic energy harvesting materials have poor mechanical properties (e.g., brittle), poor processibility, heavy weight low efficiencies, and/or high costs, which limit their applications, especially space based applications.

Therefore, there is a need for a novel device and/or method that provides better solar energy harvesting properties (e.g., more efficient) than current solar energy harvesting methods. Ideally, such a device and/or method will have good mechanical properties (e.g., flexible), good processibility, light weight, better efficiency, easy to manufacture and/or low costs.

DRAWINGS

Various features and advantages may become apparent from the detailed description set forth below when taken in conjunction with the drawings in which like reference characters identify correspondingly throughout.

SUMMARY

Figure 1:
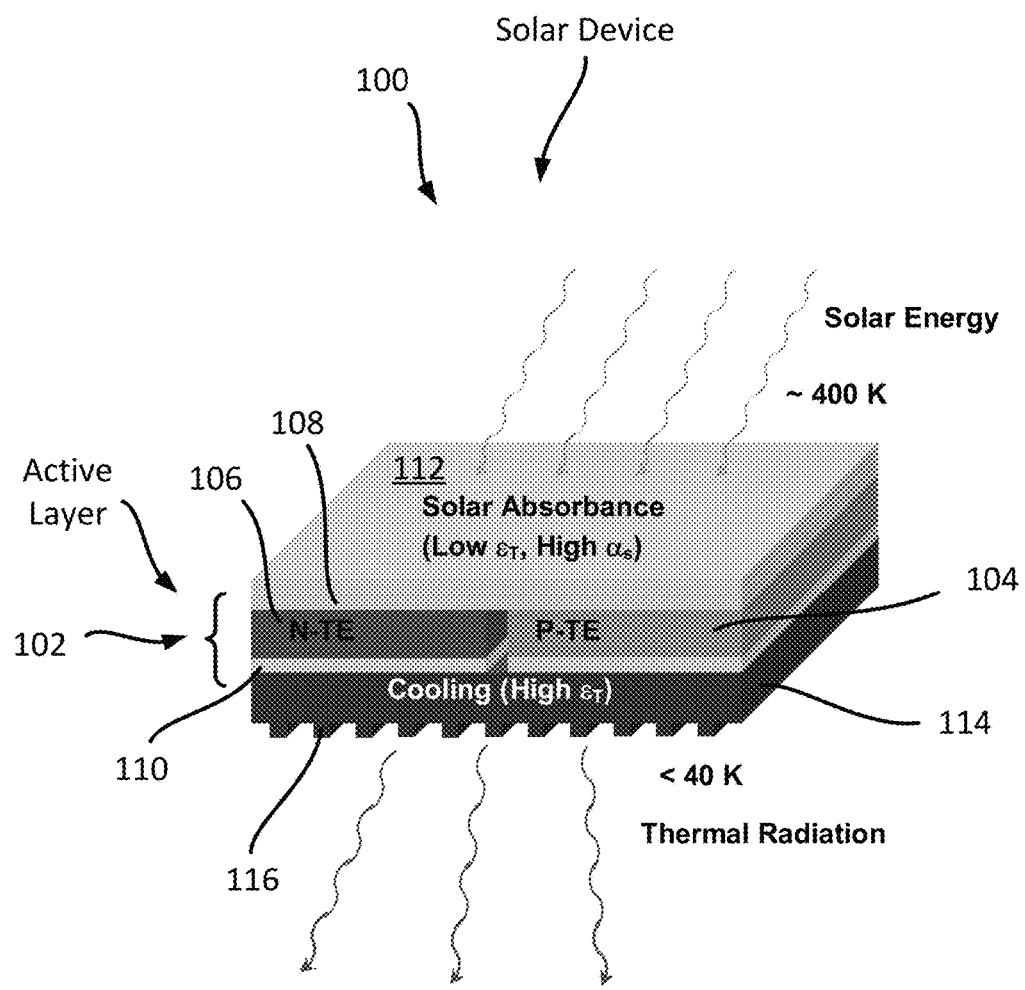
FIG. 1 illustrates a conceptual example of a solar device that includes an active layer, a solar absorption layer, and a cooling layer.

A first example provides a device that includes an active layer and a solar absorbance layer. The active layer includes a first N-type layer and a first P-type layer. The solar absorbance layer is coupled to a first surface of the active layer. The solar absorbance layer includes a polymer composite.

According to an aspect, the polymer composite includes one of at least metal salts and/or carbon nanotubes.

According to an aspect, the solar absorbance layer includes a solar absorptivity ($\alpha_s$) value that is 0.9 or greater. The solar absorbance layer further includes a thermal emissivity ($\varepsilon_T$) value that is 0.2 or less.

According to one aspect, the solar absorbance layer includes a first solar absorbance layer and a second solar absorbance layer. In some implementations, the first solar absorbance layer includes a first thermal emissivity ($\varepsilon_T$)

value that is 0.2 or less. In some implementations, the second solar absorbance layer includes a first solar absorptivity ($\alpha_s$) value that is 0.9 or greater. In some implementations, at least a portion of the first and second solar absorbance layers is separated by a spacing layer. In some implementations, the spacing layer includes one of at least air and/or a thermally insulating layer. In some implementation, the solar absorbance layer is one layer having both thermal emissivity value that is 0.2 or less and solar absorptivity value that is 0.9 or greater.

According to an aspect, the polymer composite includes one of at least metal salts, metals, metal oxide particles, ceramic salts, ceramic particles, and/or carbon nanophase materials. In some implementations, the carbon nanophase material includes one of at least carbon nanotubes, carbon nanoplatelets, and/or carbon nanoparticles.

According to one aspect, the active layer further includes a second N-type layer and a second P-type layer.

According to an aspect, the active layer further includes a first metal layer coupled to the first surface of the active layer, and a second metal layer coupled to the second surface of the active layer.

According to one aspect, the active layer is configured to provide a photovoltaic effect.

According to an aspect, the active layer is configured to provide a thermoelectric effect.

According to one aspect, the device further includes a cooling layer coupled to a second surface of the active layer. In some implementations, the cooling layer includes a thermal emissivity ($\varepsilon_T$) value that is 0.9 or greater. In some implementations, the cooling layer includes one of at least ceramic oxides, metal oxides, and/or carbon nanophase materials. In some implementations, the carbon nanophase material includes one of at least carbon nanotubes, carbon nanoplatelets, and/or carbon nanoparticles. In some implementations, the cooling layer includes several carbon nanotubes aligned in a particular direction of the cooling layer. In some implementations, the cooling layer includes a set of grooves. The set of grooves is configured to increase a surface area of the cooling layer.

According to an aspect, the device is one of at least a solar panel, a solar module, an active thermal control system, and/or a passive thermal control system.

According to one aspect, the device is configured to be flexible.

A second example provides an apparatus that includes an active means and a solar absorbance means. The active means includes a first N-type layer and a first P-type layer. The solar absorbance means is coupled to a first surface of the active means. The solar absorbance means includes a polymer composite.

According to an aspect, the solar absorbance means includes a solar absorptivity ($\alpha_s$) value that is 0.9 or greater. The solar absorbance means further includes a thermal emissivity ($\varepsilon_T$) value that is 0.2 or less.

According to one aspect, the solar absorbance means includes a first solar absorbance means and a second solar absorbance means. In some implementations, the first solar absorbance means includes a first thermal emissivity ($\varepsilon_T$) value that is 0.2 or less. In some implementations, the second solar absorbance means includes a first solar absorptivity ($\alpha_s$) value that is 0.9 or greater. In some implementations, at least a portion of the first and second solar absorbance means is separated by a spacing means. In some implementations, the spacing means includes one of at least air and/or a thermally insulating means.

According to an aspect, the polymer composite includes one of at least metal salts, ceramic salts, ceramic particles, and/or carbon nanophase materials. In some implementations, the carbon nanophase material includes one of at least carbon nanotubes, carbon nanoplatelets, and/or carbon nanoparticles.

According to one aspect, the active means further includes a second N-type layer and a second P-type layer.

According to an aspect, the active means further includes a first metal layer coupled to the first surface of the active layer, and a second metal layer coupled to the second surface of the active layer.

According to one aspect, the active means is configured to provide a photovoltaic effect.

According to an aspect, the active means is configured to provide a thermoelectric effect.

According to one aspect, the apparatus further includes a cooling means coupled to a second surface of the active means. In some implementations, the cooling means includes a thermal emissivity ($\varepsilon_T$) value that is 0.9 or greater. In some implementations, the cooling means includes one of at least ceramic oxides, metal oxides, and/or carbon nanophase materials. In some implementations, the carbon nanophase material includes one of at least carbon nanotubes, carbon nanoplatelets, and/or carbon nanoparticles. In some implementations, the cooling means includes several carbon nanotubes aligned in a particular direction of the cooling layer. In some implementations, the cooling means includes a set of grooves. The set of grooves is configured to increase a surface area of the cooling means.

According to an aspect, the apparatus is one of at least a solar panel, a solar module, an active thermal control system, and/or a passive thermal control system.

According to one aspect, the apparatus is configured to be flexible.

DETAILED DESCRIPTION

In the following description, specific details are given to provide a thorough understanding of the various aspects of the disclosure. However, it will be understood by one of ordinary skill in the art that the aspects may be practiced without these specific details.

Overview

Some implementations provide a device (e.g., solar panel) that includes an active layer and a solar absorbance layer. The active layer includes a first N-type layer and a first P-type layer. The solar absorbance layer is coupled to a first surface of the active layer. The solar absorbance layer includes a polymer composite. In some implementations, the polymer composite includes one of at least metal salts and/or metal oxides and/or carbon nanotubes. In some implementations, the solar absorbance layer includes a solar absorptivity ($\alpha_s$) value that is greater than 0.9. In some implementations, the solar absorbance layer further includes a thermal emissivity ($\varepsilon_T$) value that is less than 0.2. In some implementations, the active layer is configured to provide the photovoltaic effect. In some implementations, the active layer further includes a second N-type layer and a second P-type layer.

In some implementations, the active layer is configured to provide the thermoelectric effect. In some implementations, the device further includes a cooling layer coupled to a second surface of the active layer. In some implementations, the cooling layer includes a thermal emissivity ($\varepsilon_T$) value that is greater than 0.9. In some implementations, the cooling layer includes one of at least zinc oxides, indium oxides, and/or carbon nanotubes. In some implementations, the cooling layer includes several carbon nanotubes aligned in a particular direction of the second cooling layer. In some implementations, the cooling layer includes a set of grooves. The set of grooves is configured to increase the surface area of the cooling layer.

In some implementations, the use of a polymer composite for the solar absorbance layer and/or the cooling layer provides a solar device (e.g., solar panel) with enhanced mechanical properties. For example, in some implementations, the solar device that includes the polymer composite provides a flexible device (e.g., not brittle).

Exemplary Device Configured to Provide Solar Energy Harvesting

FIG. 1 illustrates a conceptual example of a solar device configured to provide solar energy harvesting. As shown in FIG. 1, a device 100 includes an active layer 102, a P-type layer 104, an N-type layer 106, a first metal layer 108, a second metal layer 110, a solar absorbance layer 112, and a cooling layer 114. In some implementations, the device 100 (e.g., solar device, solar panel, solar module) is configured to provide solar energy harvesting using one of at least the photovoltaic effect and/or thermoelectric effect.

A. Active Layer

In some implementations, the active layer 102 includes the P-type layer 104, the N-type layer 106, the first metal layer 108 and/or the second metal layer 110. In some implementations, the active layer 102 is configured to provide the photovoltaic effect. In some implementations, the active layer 102 is configured to provide the thermoelectric effect. In some implementations, the active layer 102 is a semiconductor device (i.e., active device). The active layer 102 may be a substrate that includes the P-type layer 104 and the N-type layer 106. The P-type layer 104 and the N-type layer 106 may be configured to operate as a p-n junction. The first and second metal layers 108 & 110 may be configured to operate as electrodes for the active layer 102.

The active layer 102 includes a first surface (e.g., top surface) and a second surface (e.g., bottom surface). The first metal layer 108 is coupled to the first surface of the active layer 102. In some implementations, the first surface layer includes the first metal layer 108. In some implementations, the first metal layer 108 is coupled to the P-type layer 104 and/or the N-type layer 106.

The second metal layer 110 is coupled to the second surface of the active layer 102. In some implementations, the second surface layer includes the second metal layer 110. In some implementations, the second metal layer 110 is coupled to the P-type layer 104 and/or the N-type layer 106. It should be noted that the position of the P-type layer 104 and/or the N-type layer 106 in the active layer 102 is merely exemplary. In some implementations, the P-type layer 104 and the N-type layer 106 may be in different positions of the active layer 102. For example, the P-type layer 104 and the N-type layer 106 may be laterally positioned (i.e., side by side) within the active layer 102. The P-type layer 104 and the N-type layer 106 may be vertically positioned (i.e., one on top of another) within the active layer 102. As such, the position of the P-type layer 104 and the N-type layer 106 in FIG. 1 should not be construed to limit the position of the P-type layer 104 and the N-type layer 106 in the active layer 102.

B. Solar Absorbance Layer

The solar absorbance layer 112 is coupled to the first surface of the active layer 102. In some implementations, the solar absorbance layer 112 is coupled to the first metal layer 108. In some implementations, the solar absorbance layer 112 is configured to improve, enhance and/or increase the energy harvesting capability (e.g., solar energy harvesting capability) of the device 100. For example, in some implementations, the solar absorbance layer 112 is configured to improve, enhance and/or increase the energy harvesting capability of the active layer 102 of the device 102. In some implementations, improving, enhancing and/or increasing the energy harvesting capability of the active layer 102 includes improving, enhancing and/or increasing the photovoltaic effect and/or thermoelectric effect of the active layer 102.

As described above, the solar absorbance layer 112 includes a polymer composite. Different implementations may use different polymer composites.

The term "composite" and/or "composite material" as used herein is defined to include a material that has two or more different materials (e.g., first material, second material, third material). In some implementations, the materials in the composite material may have the same state or have different states. In some implementations, a composite material may be a metamaterial. In some implementations, a composite material may include two or more materials that are homogenous in the composite material. That is, in some implementations, a composite material may include a homogenous material that has relatively the same property across the entire material (e.g., behaves the same across the entire material, has the same electromagnetic property across the entire material). In some implementations, a composite material may include two or more materials (including homogenous materials) that remain separate and distinct in the composite material. A composite material may be provided, manufactured, and/or created by using mixing and/or a chemical process.

In some implementations, a polymer composite may include one of at least metal salts and/or metal oxides and/or carbon nanotubes. In some implementations, the carbon nanotubes are single wall carbon nanotubes (SWCNT). Examples of metal salts include iron (Fe) salts and copper (Cu) salts.

In some implementations, the polymer composite includes zinc (Zn) oxides and/or indium (In) oxides. The polymer composite may include a polymer film coated with zing oxides and/or indium oxides. In some implementations, the polymer film coated with zinc oxide may be provided by infusing zinc salts. In some implementations, the polymer film coated with indium oxide may be provided by infusing indium salts.

Different materials will have different properties. For example, different materials will have different solar absorptivity ($\alpha_s$) values and/or different thermal emissivity ($\varepsilon_T$) values. In some implementations, using materials with different solar absoptivity and/or thermal emissivity will produce a device with different energy harvesting capability. In some implementations, different materials and/or different concentrations of materials may be used and/or chosen to fit a particular need, application, and/or design specification. In some implementations, the solar absorptivity value and/or thermal emissivity value of the solar absorbance layer 112 may be controlled and/or specified by controlling the concentration of one or more particular material (e.g., inclusions, metals, metal oxides, carbon nanotubes) in the solar absorbance layer 112. For example, the solar absorptivity value and/or thermal emissivity value of the solar absorbance layer 112 may be controlled and/or specified by controlling the concentration of a particular material (e.g., inclusions, metals, metal oxides, carbon nanotubes) in the polymer composite of the solar absorbance layer 112.

In some implementations, the solar absorbance layer 112 has a solar absorptivity ($\alpha_s$) value that is 0.9 or greater. In some implementations, the solar absorbance layer 112 has a thermal emissivity ($\varepsilon_T$) value that is 0.2 or less. In some implementations, a polymer film coated with zinc oxides or indium oxides has low thermal emissivity values (i.e., 0.2 or less). In some implementations, a polymer composite that includes Fe and/or Cu may have high thermal emissivity (i.e., 0.6 or greater) and high solar absorbance (i.e., 0.9 or greater).

C. Cooling Layer

The cooling layer 114 is coupled to a second surface of the active layer 102. In some implementations, the cooling layer 114 is coupled to the second metal layer 110. In some implementations, the cooling layer 114 is configured to provide passive cooling of the device 100 and/or the active layer 102. In some implementations, the cooling layer 114 is configured to help dissipate heat from the device 100 and/or the active layer 102. Different implementations may use different materials for the cooling layer 114. As shown in FIG. 1, the cooling layer 114 includes several grooves 116. In some implementations, the grooves are configured to increase the surface area of the cooling layer 114. In some implementations, increase the surface area of the cooling layer 114 increases, improves, and/or enhances the thermal emissivity (e.g., heat dissipation) of the cooling layer 114. In some implementations, the cooling layer 114 includes carbon nanotubes (e.g., single wall carbon nanotubes (SW-CNTs)). In such instances, the carbon nanotubes may be aligned in a particular direction of the cooling layer 114 (e.g., carbon nanotubes aligned along surface of the cooling layer 114). In some implementations, the cooling layer 114 has a thermal emissivity ($\varepsilon_T$) value that is 0.9 or greater.

As described above, different implementations may use different materials for the solar absorbance layer 112 and/or the cooling layer 114. The various materials for the solar absorbance layer 112 and/or the cooling layer will be further described below. However, before describing such materials, different implementations of a device configured to harvest solar energy will be further described.

In some implementations, the cooling layer 114 is an optional layer of the device (e.g., solar device, solar panel, solar module). As such, in some implementations, a device (e.g., solar device, solar panel, solar module) configured to harvest energy may include an active layer and a solar absorbance layer. In such instances, the active layer is configured to provide the photovoltaic effect. An example of a device that includes a solar absorbance layer, but not a cooling layer is further described below.

Figure 2:
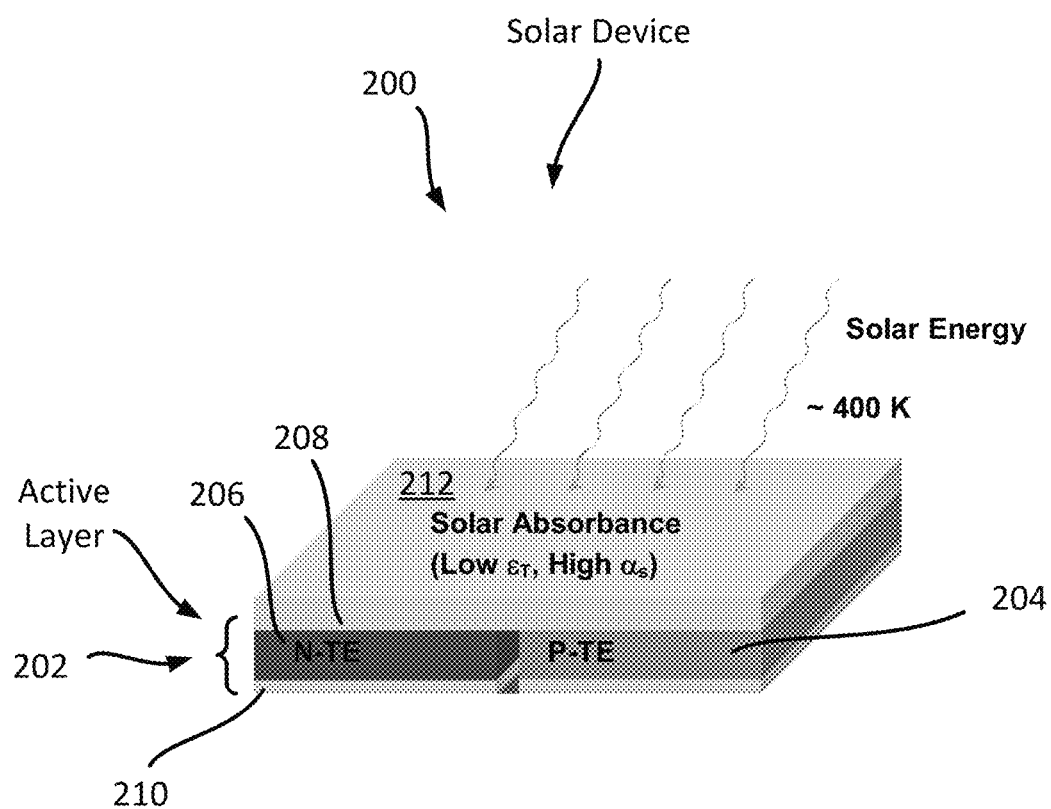
FIG. 2 illustrates a conceptual example of a solar device that includes an active layer, and a solar absorption layer.

Exemplary Device Configured to Provide Solar Energy Harvesting without Cooling Layer FIG. 2 illustrates a conceptual example of a device configured to provide solar energy harvesting. Specifically, FIG. 2 illustrates a solar device 200 configured to provide solar energy harvesting using the thermoelectric effect. As shown in FIG. 2, the device 200 includes an active layer 202, a P-type layer 204, an N-type layer 206, a first metal layer 208, a second metal layer 210, and a solar absorbance layer 212. In some implementations, the device 200 (e.g., solar device, solar panel, solar module) is configured to provide solar energy harvesting using the photovoltaic effect.

A. Active Layer

In some implementations, the active layer 202 includes the P-type layer 204, the N-type layer 206, the first metal layer 208 and/or the second metal layer 210. In some implementations, the active layer 202 is configured to provide the photovoltaic effect. In some implementations, the active layer 202 is a semiconductor device (i.e., active device). The active layer 202 may be a substrate that includes the P-type layer 204 and the N-type layer 206. The P-type layer 204 and the N-type layer 206 may be configured to operate as a p-n junction. The first and second metal layers 208 & 210 may be configured to operate as electrodes for the active layer 202.

The active layer 202 includes a first surface (e.g., top surface) and a second surface (e.g., bottom surface). The first metal layer 208 is coupled to the first surface of the active layer 202. In some implementations, the first surface layer includes the first metal layer 208. In some implementations, the first metal layer 208 is coupled to the P-type layer 204 and/or the N-type layer 206.

The second metal layer 210 is coupled to the second surface of the active layer 202. In some implementations, the second surface layer includes the second metal layer 210. In some implementations, the second metal layer 210 is coupled to the P-type layer 204 and/or the N-type layer 206. It should be noted that the position of the P-type layer 204 and/or the N-type layer 206 in the active layer 202 is merely exemplary. In some implementations, the P-type layer 204 and the N-type layer 206 may be in different positions of the active layer 202. For example, the P-type layer 204 and the N-type layer 206 may be laterally positioned (i.e., side by side) within the active layer 202. The P-type layer 204 and the N-type layer 206 may be vertically positioned (i.e., one on top of another) within the active layer 202. As such, the position of the P-type layer 204 and the N-type layer 206 in FIG. 2 should not be construed to limit the position of the P-type layer 204 and the N-type layer 206 in the active layer 202.

B. Solar Absorbance Layer

The solar absorbance layer 212 is coupled to the first surface of the active layer 202. In some implementations, the solar absorbance layer 212 is coupled to the first metal layer 208. In some implementations, the solar absorbance layer 212 is configured to improve, enhance and/or increase the energy harvesting capability (e.g., solar energy harvesting capability) of the device 200. For example, in some implementations, the solar absorbance layer 212 is configured to improve, enhance and/or increase the energy harvesting capability of the active layer 202 of the device 202. In some implementations, improving, enhancing and/or increasing the energy harvesting capability of the active layer 202 includes improving, enhancing and/or increasing the photovoltaic effect and/or thermoelectric effect of the active layer 202.

As described above, the solar absorbance layer 212 includes a polymer composite. Different implementations may use different polymer composites. In some implementations, a polymer composite may include one of at least metal salts and/or metal oxide particles and/or carbon nanotubes. In some implementations, the carbon nanotubes are single wall carbon nanotubes (SWCNT). Examples of metal salts employed for metal or metal oxide particles or include iron (Fe) salts and copper (Cu) salts.

In some implementations, the polymer composite includes zinc (Zn) oxides and/or indium (In) oxides. The polymer composite may include a polymer film coated with zing oxides and/or indium oxides. In some implementations, the polymer film coated with zinc oxide may be provided by infusing zinc salts. In some implementations, the polymer film coated with indium oxide may be provided by infusing indium salts.

Different materials will have different properties. For example, different materials will have different solar absorptivity ($\alpha_s$) values and/or different thermal emissivity ($\varepsilon_T$) values. In some implementations, using materials with different solar absoptivity and/or thermal emissivity will produce a device with different energy harvesting capability. In some implementations, different materials and/or different concentrations of materials may be used and/or chosen to fit a particular need, application, and/or design specification. In some implementations, the solar absorptivity value and/or thermal emissivity value of the solar absorbance layer 212 may be controlled and/or specified by controlling the concentration of one or more particular material (e.g., inclusions, metals, metal oxides, carbon nanotubes) in the solar absorbance layer 212. For example, the solar absorptivity value and/or thermal emissivity value of the solar absorbance layer 212 may be controlled and/or specified by controlling the concentration of a particular material (e.g., inclusions, metals, metal oxides, carbon nanotubes) in the polymer composite of the solar absorbance layer 212.

In some implementations, the solar absorbance layer 212 has a solar absorptivity ($\alpha_s$) value that is 0.9 or greater. In some implementations, the solar absorbance layer 212 has a thermal emissivity ($\varepsilon_T$) value that is 0.2 or less. In some implementations, a polymer film coated with zinc oxides or indium oxides has low thermal emissivity values (i.e., 0.2 or less). In some implementations, a polymer composite that includes Fe and/or Cu may have high thermal emissivity (i.e., 0.6 or greater) and high solar absorbance (i.e., 0.9 or greater).

Exemplary Device that Includes Several Solar Absorption Layers

Figure 3:
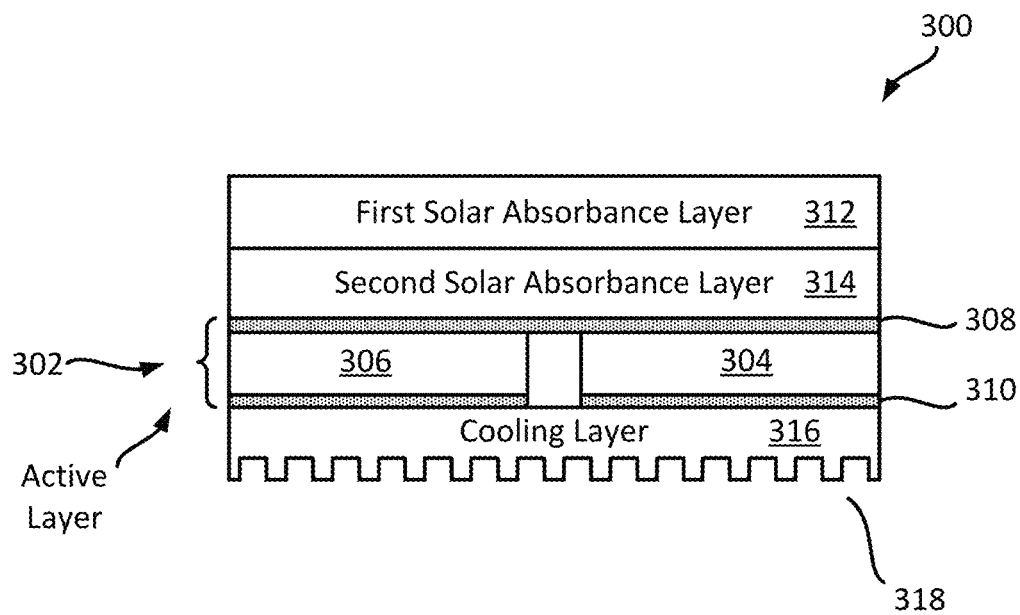
FIG. 3 illustrates a conceptual example of a solar device that includes an active layer, a first solar absorption layer, a second absorption layer, and a cooling layer.

In some implementations, a solar device configured for solar energy harvesting may include several solar absorption layers. FIG. 3 illustrates a conceptual example of a solar device configured to provide solar energy harvesting. As shown in FIG. 3, a device 300 includes an active layer 302, a P-type layer 304, a N-type layer 306, a first metal layer 308, a second metal layer 310, a first solar absorbance layer 312, a second solar absorbance layer 314, and a cooling layer 316. In some implementations, the device 300 (e.g., solar device, solar panel, solar module) is configured to provide solar energy harvesting using one of at least the photovoltaic effect and/or thermoelectric effect.

A. Active Layer

In some implementations, the active layer 302 includes the P-type layer 304, the N-type layer 306, the first metal layer 308 and/or the second metal layer 310. In some implementations, the active layer 302 is configured to provide the photovoltaic effect. In some implementations, the active layer 302 is configured to provide the thermoelectric effect. In some implementations, the active layer 302 is a semiconductor device (e.g., active device). The active layer 302 may be a substrate that includes the P-type layer 304 and the N-type layer 306. The P-type layer 304 and the N-type layer 306 may be configured to operate as a p-n junction. The first and second metal layers 308 & 310 may be configured to operate as electrodes for the active layer 302.

The active layer 302 includes a first surface (e.g., top surface) and a second surface (e.g., bottom surface). The first metal layer 308 is coupled to the first surface of the active layer 302. In some implementations, the first surface layer includes the first metal layer 308. In some implementations, the first metal layer 308 is coupled to the P-type layer 304 and/or the N-type layer 306.

The second metal layer 310 is coupled to the second surface of the active layer 302. In some implementations, the second surface layer includes the second metal layer 310. In some implementations, the second metal layer 310 is coupled to the P-type layer 304 and/or the N-type layer 306. It should be noted that the position of the P-type layer 304 and/or the N-type layer 306 in the active layer 302 is merely exemplary. In some implementations, the P-type layer 304 and the N-type layer 306 may be in different positions of the active layer 302. For example, the P-type layer 304 and the N-type layer 306 may be laterally positioned (i.e., side by side) within the active layer 302. The P-type layer 304 and the N-type layer 306 may be vertically positioned (i.e., one on top of another) within the active layer 302. As such, the position of the P-type layer 304 and the N-type layer 306 in FIG. 3 should not be construed to limit the position of the P-type layer 304 and the N-type layer 306 in the active layer 302.

B. Solar Absorbance Layers

The second solar absorbance layer 314 is coupled to the first surface of the active layer 302. In some implementations, the second solar absorbance layer 314 is coupled to the first metal layer 308. The first solar absorbance layer 312 is coupled to the second solar absorbance layer 314. In some implementations, the first solar absorbance layer 312 and/or the second absorbance layer 314 is configured to improve, enhance and/or increase the energy harvesting capability (e.g., solar energy harvesting capability) of the device 300. For example, in some implementations, the first and/or second solar absorbance layers 312 & 314 is configured to improve, enhance and/or increase the energy harvesting capability of the active layer 302 of the device 300. In some implementations, improving, enhancing and/or increasing the energy harvesting capability of the active layer 302 includes improving, enhancing and/or increasing the photovoltaic effect and/or thermoelectric effect of the active layer 302.

As described above, the first solar absorbance layer 312 and/or the second solar absorbance layer 314 may include a polymer composite. Different implementations may use different polymer composites. Any of the polymer composites described in the present disclosure may be used for the first and/or second solar absorbance layer 312 & 314. In some implementations, a polymer composite may include one of at least metal salts and/or metals and/or metal oxide particles and/or carbon nanotubes. In some implementations, the carbon nanotubes are single wall carbon nanotubes (SWCNT). Examples of metal salts employed for metals or metal oxide particles include iron (Fe) salts and copper (Cu) salts. In some implementations, the polymer composite includes zinc (Zn) oxides and/or indium (In) oxides. The polymer composite may include a polymer film coated with zing oxides and/or indium oxides. In some implementations, the polymer film coated with zinc oxide may be provided by infusing zinc salts. In some implementations, the polymer film coated with indium oxide may be provided by infusing indium salts.

Different materials will have different properties. For example, different materials will have different solar absorptivity ($\alpha_s$) values and/or different thermal emissivity ($\varepsilon_T$) values. In some implementations, using materials with different solar absoptivity and/or thermal emissivity will produce a device with different energy harvesting capability. In some implementations, different materials and/or different concentrations of materials may be used and/or chosen to fit a particular need, application, and/or design specification. In some implementations, the solar absorptivity value and/or thermal emissivity value of the first and second solar absorbance layers 312 & 314 may be controlled and/or specified by controlling the concentration of one or more particular material (e.g., inclusions, metals, metal oxides, carbon nanotubes) in the first and second solar absorbance layer 312 & 314. For example, the solar absorptivity value and/or thermal emissivity value of the first and second solar absorbance layers 312 & 314 may be controlled and/or specified by controlling the concentration of a particular material (e.g., inclusions, metals, metal oxides, carbon nanotubes) in the polymer composite of the first solar absorbance layer 312 and/or the second solar absorbance layer 314.

In some implementations, the first solar absorbance layer 312 has a thermal emissivity ($\varepsilon_T$) value that is 0.2 or less. In some implementations, the second solar absorbance layer 314 has a solar absorptivity ($\alpha_s$) value that is 0.9 or greater. In some implementations, the first solar absorbance layer 312 has a solar absorptivity ($\alpha_s$) value that is 0.9 or greater. In some implementations, the second solar absorbance layer 314 has a thermal emissivity ($\varepsilon_T$) value that is 0.2 or less.

C. Cooling Layer

The cooling layer 316 is coupled to a second surface of the active layer 302. In some implementations, the cooling layer 316 is coupled to the second metal layer 310. In some implementations, the cooling layer 316 is configured to provide passive cooling of the device 300 and/or the active layer 302. In some implementations, the cooling layer 316 is configured to help dissipate heat from the device 300 and/or the active layer 302. Different implementations may use different materials for the cooling layer 316. As shown in FIG. 3, the cooling layer 316 includes several grooves 318. In some implementations, the grooves 318 are configured to increase the surface area of the cooling layer 316. In some implementations, increase the surface area of the cooling layer 316 increases, improves, and/or enhances the thermal emissivity (e.g., heat dissipation) of the cooling layer 316. In some implementations, the cooling layer 316 includes carbon nanotubes (e.g., single wall carbon nanotubes (SW-CNTs)). In such instances, the carbon nanotubes may be aligned in a particular direction of the cooling layer 316 (e.g., carbon nanotubes aligned along surface of the cooling layer 316). In some implementations, the cooling layer 316 has a thermal emissivity ($\varepsilon_T$) value that is 0.9 or greater.

Figure 4:
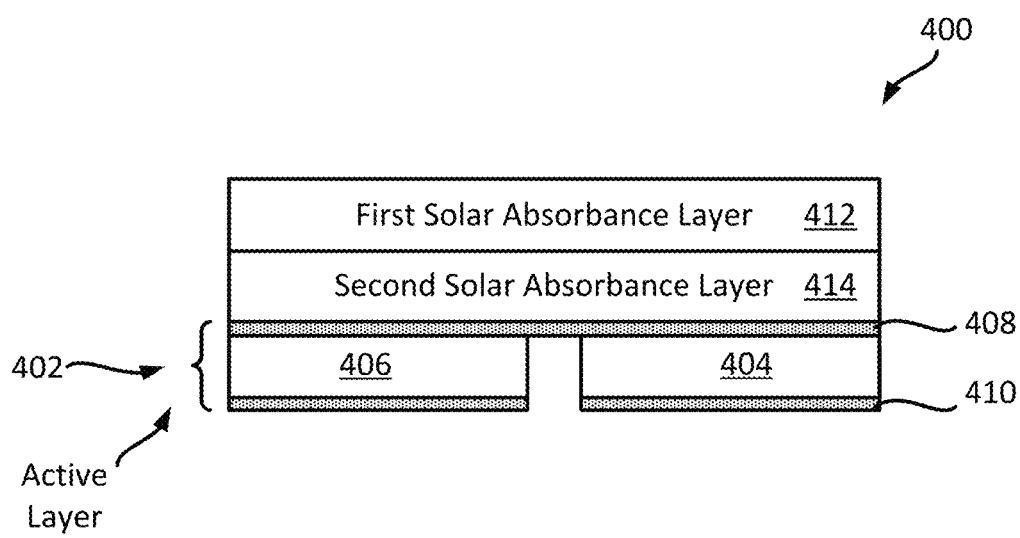
FIG. 4 illustrates a conceptual example of a solar device that includes an active layer, a first solar absorption layer and a second absorption layer.

In some implementations, a device may not include a cooling layer. FIG. 4 illustrates a conceptual example of a solar device configured to provide solar energy harvesting but does not include a cooling layer. As shown in FIG. 4, a device 400 includes an active layer 402, a P-type layer 404, a N-type layer 406, a first metal layer 408, a second metal layer 410, a first solar absorbance layer 412, and a second solar absorbance layer 414. In some implementations, the device 400 (e.g., solar device, solar panel, solar module) is configured to provide solar energy harvesting using the photovoltaic effect. In some implementations, the solar device 400 of FIG. 4 is similar to the solar device 300 of FIG. 3, except that the solar device 400 does not include a cooling layer.

Exemplary Device That Utilizes Green House Effect

Figure 5:
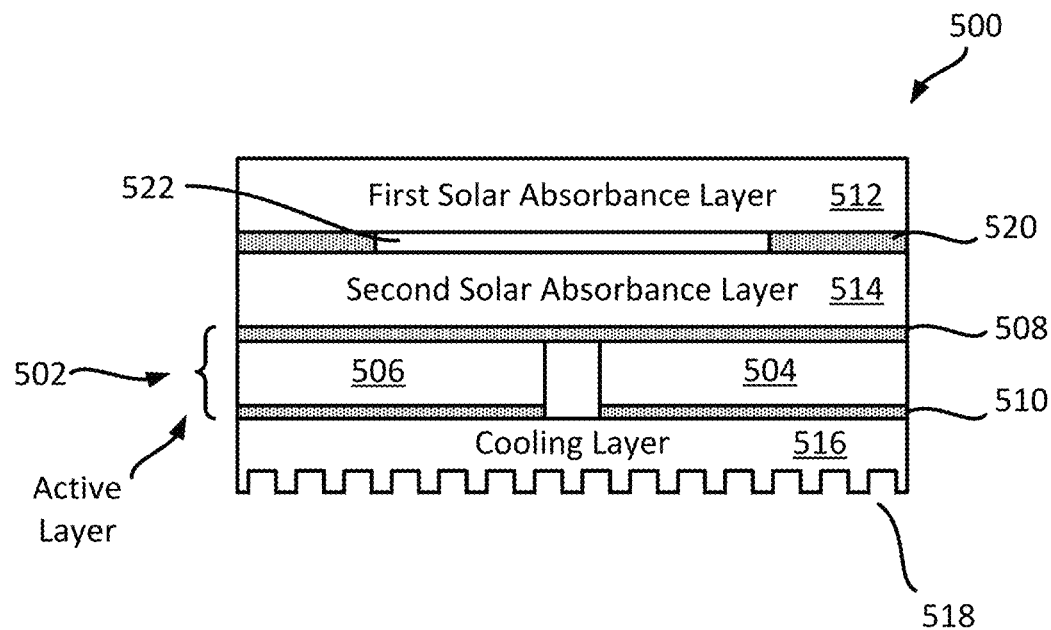
FIG. 5 illustrates a conceptual example of a solar device that utilizes the greenhouse effect and includes an active layer, a first solar absorption layer, a second solar absorption layer, a spacing layer, and a cooling layer.

In some implementations, a solar device configured for solar energy harvesting may include several solar absorption layers and utilize the greenhouse effect to improve, increase and/or enhance the solar energy harvesting capability of the solar device. FIG. 5 illustrates a conceptual example of a solar device configured to provide solar energy harvesting. As shown in FIG. 5, a device 500 includes an active layer 502, a P-type layer 504, a N-type layer 506, a first metal layer 508, a second metal layer 510, a first solar absorbance layer 512, a second solar absorbance layer 514, a cooling layer 516, a first spacing layer 520, and a second spacing layer 522. In some implementations, the device 500 (e.g., solar device, solar panel) is configured to provide solar energy harvesting using one of at least the photovoltaic effect and/or thermoelectric effect.

A. Active Layer

In some implementations, the active layer 502 includes the P-type layer 504, the N-type layer 506, the first metal layer 508 and/or the second metal layer 510. In some implementations, the active layer 502 is configured to provide the photovoltaic effect. In some implementations, the active layer 502 is configured to provide the thermoelectric effect. In some implementations, the active layer 502 is a semiconductor device (e.g., active device). The active layer 502 may be a substrate that includes the P-type layer 504 and the N-type layer 506. The P-type layer 504 and the N-type layer 506 may be configured to operate as a p-n junction. The first and second metal layers 508 & 510 may be configured to operate as electrodes for the active layer 502.

The active layer 502 includes a first surface (e.g., top surface) and a second surface (e.g., bottom surface). The first metal layer 508 is coupled to the first surface of the active layer 502. In some implementations, the first surface layer includes the first metal layer 508. In some implementations, the first metal layer 508 is coupled to the P-type layer 504 and/or the N-type layer 506.

The second metal layer 510 is coupled to the second surface of the active layer 502. In some implementations, the second surface layer includes the second metal layer 510. In some implementations, the second metal layer 510 is coupled to the P-type layer 504 and/or the N-type layer 506. It should be noted that the position of the P-type layer 504 and/or the N-type layer 506 in the active layer 502 is merely exemplary. In some implementations, the P-type layer 504 and the N-type layer 506 may be in different positions of the active layer 502. For example, the P-type layer 504 and the N-type layer 506 may be laterally positioned (e.g., side by side) within the active layer 502. The P-type layer 504 and the N-type layer 506 may be vertically positioned (e.g., one on top of another) within the active layer 502. As such, the position of the P-type layer 504 and the N-type layer 506 in FIG. 5 should not be construed to limit the position of the P-type layer 504 and the N-type layer 506 in the active layer 502.

B. Solar Absorbance Layers

The second solar absorbance layer 514 is coupled to the first surface of the active layer 502. In some implementations, the second solar absorbance layer 514 is coupled to the first metal layer 508. As shown in FIG. 5, a first spacing layer 520 and a second spacing layer 522 is between the first solar absorbance layer 512 and the second solar absorbance layer 514. In some implementations, the first spacing layer 520 is a metal layer. In some implementations, the second spacing layer 522 includes air. In some implementations, the second spacing layer 522 is a thermally insulating layer. In some implementations, the second spacing layer 522 is configured to allow air to remain between the first solar absorbance layer 512 and the second solar absorbance layer 514. In some implementations, air (and/or a thermally insulating layer) that is in the second spacing layer 520 may reflect back heat/energy that emanate from active layer 502 and/or second solar absorbance layer 514. By trapping some or all of the air in the second spacing layer 522, it creates a greenhouse effect that effectively increases the temperature on the solar absorbance layer side of the device 500. This increase in temperature also increases the temperature difference between the solar absorbance side of the device 500 and the cooling side of the device 500, which may improve, enhance, and/or lead to greater solar energy harvesting in some implementations.

In some implementations, the first solar absorbance layer 512, the second absorbance layer 514, the first spacing layer 520, and/or the second spacing layer 522 is configured to improve, enhance and/or increase the energy harvesting capability (e.g., solar energy harvesting capability) of the device 500. For example, in some implementations, the first, second solar absorbance layers 512 & 514, the first spacing layer 520, and/or the second spacing layer 522 is configured to improve, enhance and/or increase the energy harvesting capability of the active layer 502 of the device 500. In some implementations, improving, enhancing and/or increasing the energy harvesting capability of the active layer 502 includes improving, enhancing and/or increasing the photovoltaic effect and/or thermoelectric effect of the active layer 502.

As described above, the first solar absorbance layer 512 and/or the second solar absorbance layer 514 may include a polymer composite. Different implementations may use different polymer composites. Any of the polymer composites described in the present disclosure may be used for the first and/or second solar absorbance layer 512 & 514. In some implementations, a polymer composite may include one of at least metal salts and/or metals and/or metal oxide particles and/or carbon nanotubes. In some implementations, the carbon nanotubes are single wall carbon nanotubes (SWCNT). Examples of metal salts include iron (Fe) salts and copper (Cu) salts. In some implementations, the polymer composite includes zinc (Zn) oxides and/or indium (In) oxides. The polymer composite may include a polymer film coated with zing oxides, indium oxides and/or indium tin oxides. In some implementations, the polymer film coated with zinc oxide may be provided by infusing zinc salts. In some implementations, the polymer film coated with indium oxide may be provided by infusing indium salts.

Different materials will have different properties. For example, different materials will have different solar absorptivity ($\alpha_s$) values and/or different thermal emissivity ($\varepsilon_T$) values. In some implementations, using materials with different solar absoptivity and/or thermal emissivity will produce a device with different energy harvesting capability. In some implementations, different materials and/or different concentrations of materials may be used and/or chosen to fit a particular need, application, and/or design specification. In some implementations, the solar absorptivity value and/or thermal emissivity value of the first and second solar absorbance layers 512 & 514 may be controlled and/or specified by controlling the concentration of one or more particular material (e.g., inclusions, metals, metal oxides, carbon nanotubes) in the first and second solar absorbance layer 512 & 514. For example, the solar absorptivity value and/or thermal emissivity value of the first and second solar absorbance layers 512 & 514 may be controlled and/or specified by controlling the concentration of a particular material (e.g., inclusions, metals, metal oxides, carbon nanotubes) in the polymer composite of the first solar absorbance layer 512 and/or the second solar absorbance layer 514.

In some implementations, the first solar absorbance layer 512 has a thermal emissivity ($\varepsilon_T$) value that is 0.2 or less. In some implementations, the second solar absorbance layer 514 has a solar absorptivity ($\alpha_s$) value that is 0.9 or greater In some implementations, the first solar absorbance layer 512 has a solar absorptivity ($\alpha_s$) value that is 0.9 or greater. In some implementations, the second solar absorbance layer 514 has a thermal emissivity ($\varepsilon_T$) value that is 0.2 or less.

C. Cooling Layer

The cooling layer 516 is coupled to a second surface of the active layer 502. In some implementations, the cooling layer 516 is coupled to the second metal layer 510. In some implementations, the cooling layer 516 is configured to provide passive cooling of the device 500 and/or the active layer 502. In some implementations, the cooling layer 516 is configured to help dissipate heat from the device 500 and/or the active layer 502. Different implementations may use different materials for the cooling layer 516. As shown in FIG. 5, the cooling layer 516 includes several grooves 518. In some implementations, the grooves 518 are configured to increase the surface area of the cooling layer 516. In some implementations, increase the surface area of the cooling layer 516 increases, improves, and/or enhances the thermal emissivity (e.g., heat dissipation) of the cooling layer 516. In some implementations, the cooling layer 516 includes carbon nanotubes (e.g., single wall carbon nanotubes (SW-CNTs)). In such instances, the carbon nanotubes may be aligned in a particular direction of the cooling layer 516 (e.g., carbon nanotubes aligned along surface of the cooling layer 516). In some implementations, the cooling layer 516 has a thermal emissivity ($\varepsilon_T$) value that is 0.9 or greater.

Figure 6:
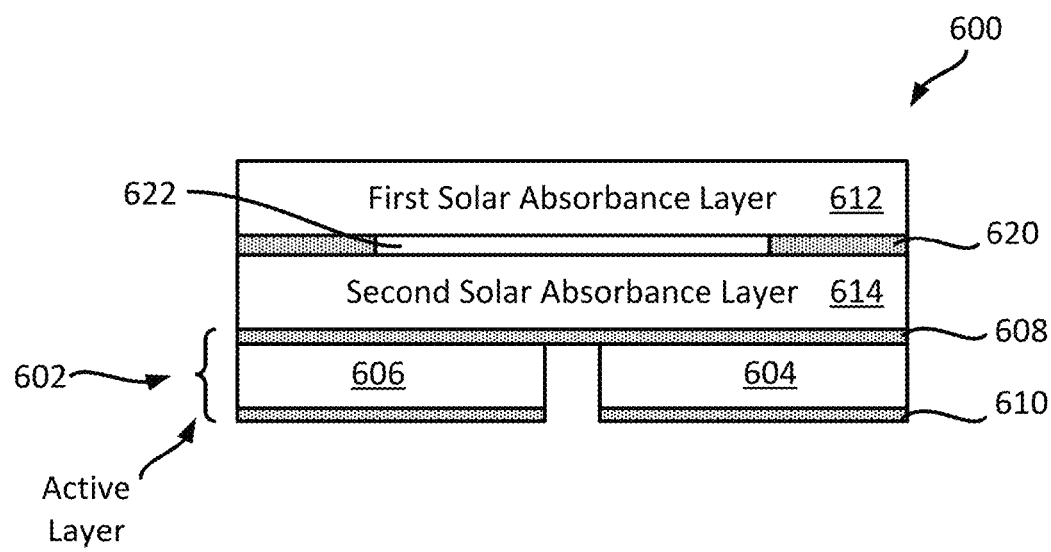
FIG. 6 illustrates a conceptual example of a solar device that utilizes the greenhouse effect and includes an active layer, a first solar absorption layer, a second solar absorption layer, and a spacing layer.

In some implementations, a device may not include a cooling layer. FIG. 6 illustrates a conceptual example of a solar device configured to provide solar energy harvesting but does not include a cooling layer. As shown in FIG. 6, a device 600 includes an active layer 602, a P-type layer 604, a N-type layer 606, a first metal layer 608, a second metal layer 610, a first solar absorbance layer 612, and a second solar absorbance layer 614. In some implementations, the device 600 (e.g., solar device, solar panel) is configured to provide solar energy harvesting using the photovoltaic effect. In some implementations, the solar device 600 of FIG. 6 is similar to the solar device 500 of FIG. 5, except that the solar device 600 does not include a cooling layer.

Exemplary Device that Includes Multiple p-n Junctions

Figure 7:
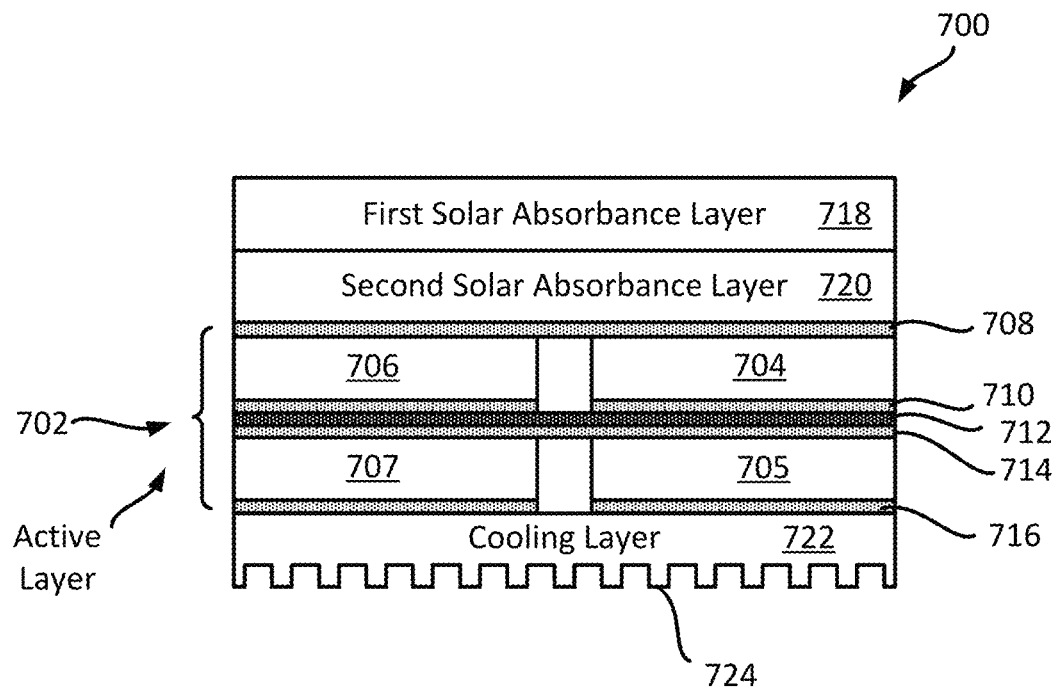
FIG. 7 illustrates a conceptual example of a solar device that includes an active layer with several p-n junctions, a first solar absorption layer, a second solar absorption layer, and a cooling layer.

In some implementations, a solar device configured for solar energy harvesting may include an active layer that includes several p-n junctions to improve, increase and/or enhance the solar energy harvesting capability of the solar device. FIG. 7 illustrates a conceptual example of a solar device configured to provide solar energy harvesting. As shown in FIG. 7, a device 700 includes an active layer 702, a first P-type layer 704, a second P-type layer 705, a first N-type layer 706, a second N-type layer 707, a first metal layer 708, a second metal layer 710, a third metal layer 712, a fourth metal layer 714, a fifth metal layer 716, a first solar absorbance layer 718, a second solar absorbance layer 720, and a cooling layer 722. In some implementations, the device 700 (e.g., solar device, solar panel) is configured to provide solar energy harvesting using one of at least the photovoltaic effect and/or thermoelectric effect. In some implementations, the additional P-type and N-type layers is configured to improve, increase, and/or enhance the energy harvesting capabilities of the device 700.

In some implementations, the active layer 702 is several active layers (e.g., two or more active layers) coupled to each other. For example, in some implementations, the active layer 702 includes a first active layer and a second active layer. In some implementations, the first active layer includes the first P-type layer 704 and the first N-type layer 706. In some implementations, the second active layer includes the second P-type layer 705 and the second N-type layer 707. In some implementations, the first and second active layers are stacked on top of each other. In some implementations, several active layers (e.g., more than two active layers) are stacked on top of each other. Each active layer may include one or more p-n junctions.

In some implementations, the first and/or second solar absorbance layers 718 & 720 is a polymer composite. However, different implementations may use different materials for the first and/or second solar absorbance layers 718 & 720. In some implementations, the first solar absorbance layer 718 has a thermal emissivity ($\varepsilon_T$) value that is 0.2 or less. In some implementations, the second solar absorbance layer 720 has a solar absorptivity ($\alpha_s$) value that is 0.9 or greater. In some implementations, the first solar absorbance layer 718 has a solar absorptivity ($\alpha_s$) value that is 0.9 or greater. In some implementations, the second solar absorbance layer 720 has a thermal emissivity ($\varepsilon_T$) value that is 0.2 or less.

Figure 8:
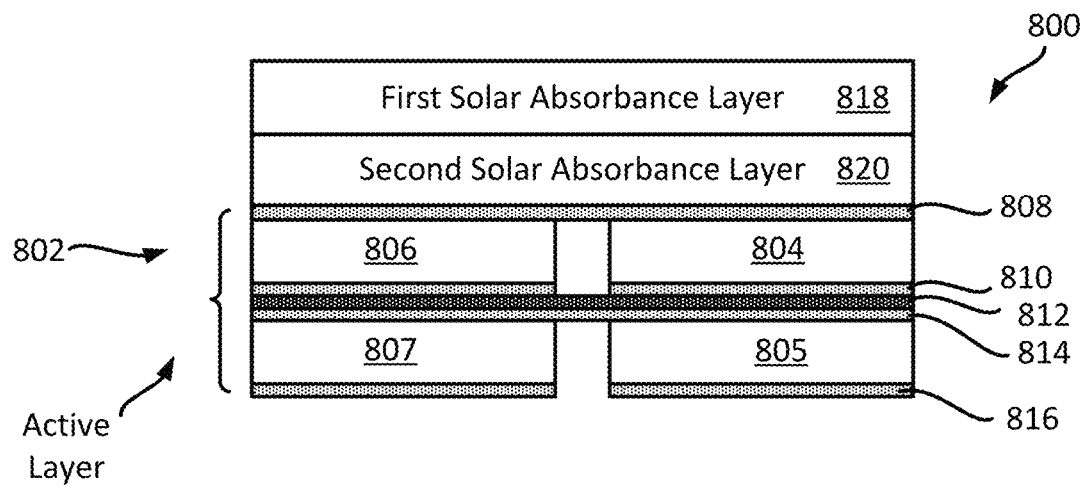
FIG. 8 illustrates a conceptual example of a solar device that includes an active layer with several p-n junctions, a first solar absorption layer, and a second solar absorption layer.

In some implementations, a device may not include a cooling layer. FIG. 8 illustrates a conceptual example of a solar device configured to provide solar energy harvesting but does not include a cooling layer. As shown in FIG. 8, a device 800 includes an active layer 802, a first P-type layer 804, a second P-type layer 805, a first N-type layer 806, a second N-type layer 807, a first metal layer 808, a second metal layer 810, a third metal layer 812, a fourth metal layer 814, a fifth metal layer 816, a first solar absorbance layer 818, and a second solar absorbance layer 820. In some implementations, the device 800 (e.g., solar device, solar panel) is configured to provide solar energy harvesting using the photovoltaic effect. In some implementations, the solar device 800 of FIG. 8 is similar to the solar device 700 of FIG. 7, except that the solar device 800 does not include a cooling layer.

Having described various devices (e.g., solar device, solar panel, solar module) that are configured to energy harvest, the different materials used to in such devices will now be described below.

Exemplary Materials and Properties

Different components of the solar device (e.g., solar devices 100, 200, 300, 400, 500, 600, 700, 800) may use different materials. In some implementations, the solar absorbance layer of a solar device includes a polymer composite. Different solar absorbance layers may use different polymer composite.

In some implementations, a polymer composite may include one of at least ceramic, silicon, silicon oxide, metal salts ceramic salts, ceramic particles and/or carbon nanophase materials. In some implementations, a carbon nanophase material includes one of at least carbon nanotubes, carbon nanoplatelets, and/or carbon nanoparticles. In some implementations, the carbon nanotubes are single wall carbon nanotubes (SWCNT). Examples of metal salts employed for metal or metal oxide particles include iron (Fe) salts and copper (Cu) salts. In some implementations, the polymer composite includes zinc (Zn) oxides and/or indium (In) oxides. The polymer composite may include a polymer film coated with zing oxides and/or indium oxides. In some implementations, the polymer film coated with zinc oxide may be provided by infusing zinc salts. In some implementations, the polymer film coated with indium oxide may be provided by infusing indium salts.

Different materials will have different properties. For example, different materials will have different solar absorptivity ($\alpha_s$) values and/or different thermal emissivity ($\varepsilon_T$) values. In some implementations, using materials with different solar absoptivity and/or thermal emissivity will produce a device with different energy harvesting capability. In some implementations, different materials and/or different concentrations of materials may be used and/or chosen to fit a particular need, application, and/or design specification. In some implementations, the solar absorptivity value and/or thermal emissivity value of the solar absorbance layer may be controlled and/or specified by controlling the concentration of one or more particular material (e.g., inclusions, metals, metal oxides, carbon nanotubes) in the solar absorbance layer. For example, the solar absorptivity value and/or thermal emissivity value of the solar absorbance layer may be controlled and/or specified by controlling the concentration of a particular material (e.g., inclusions, metals, metal oxides, carbon nanotubes) in the polymer composite of the solar absorbance layer.

In some implementations, the solar absorbance layer has a solar absorptivity ($\alpha_s$) value that is 0.9 or greater. In some implementations, the solar absorbance layer has a thermal emissivity ($\varepsilon_T$) value that is 0.2 or less. In some implementations, a polymer film coated with zinc oxides or indium oxides has low thermal emissivity values (i.e., 0.2 or less). In some implementations, a polymer composite that includes Fe and/or Cu may have high thermal emissivity (i.e., 0.6 or greater) and high solar absorbance (i.e., 0.9 or greater).

Figure 9:
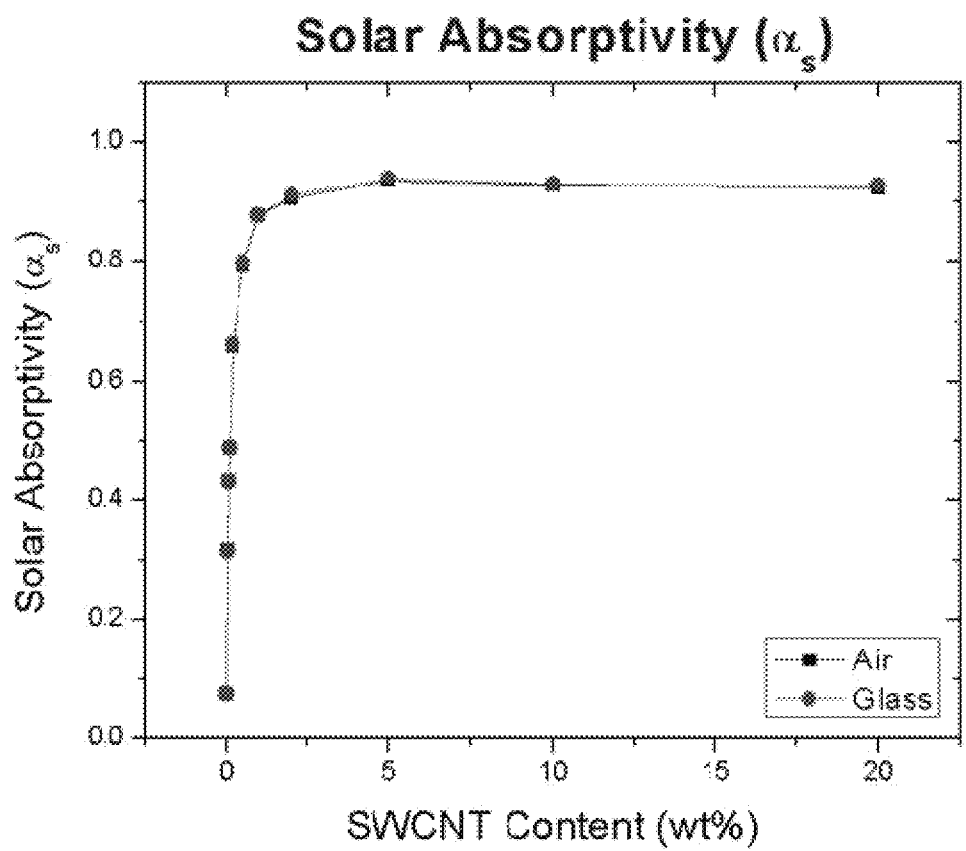
FIG. 9 illustrates a graph that shows the solar absorptivity as a function of the concentration of SWCNT in a polymer composite.

FIG. 9 illustrates a graph shows the solar absorptivity of a polymer composite that includes single wall carbon nanotubes (SWCNT) and a polyimide. Specifically, FIG. 9 illustrates a graph that shows the solar absorptivity as a function of the concentration of SWCNT in a polymer composite. As shown in FIG. 9, the solar absorptivity of the polymer composite increases very effectively with increasing SWCNT concentration until leveling out above one weight percent SWCNT. In some implementations, this was mainly caused by a decrease in solar transmissivity although reflectance did slightly decrease with increasing SWCNT concentration. In lower SWCNT concentrations the solar absorptivity increased with film thickness.

Figure 10:
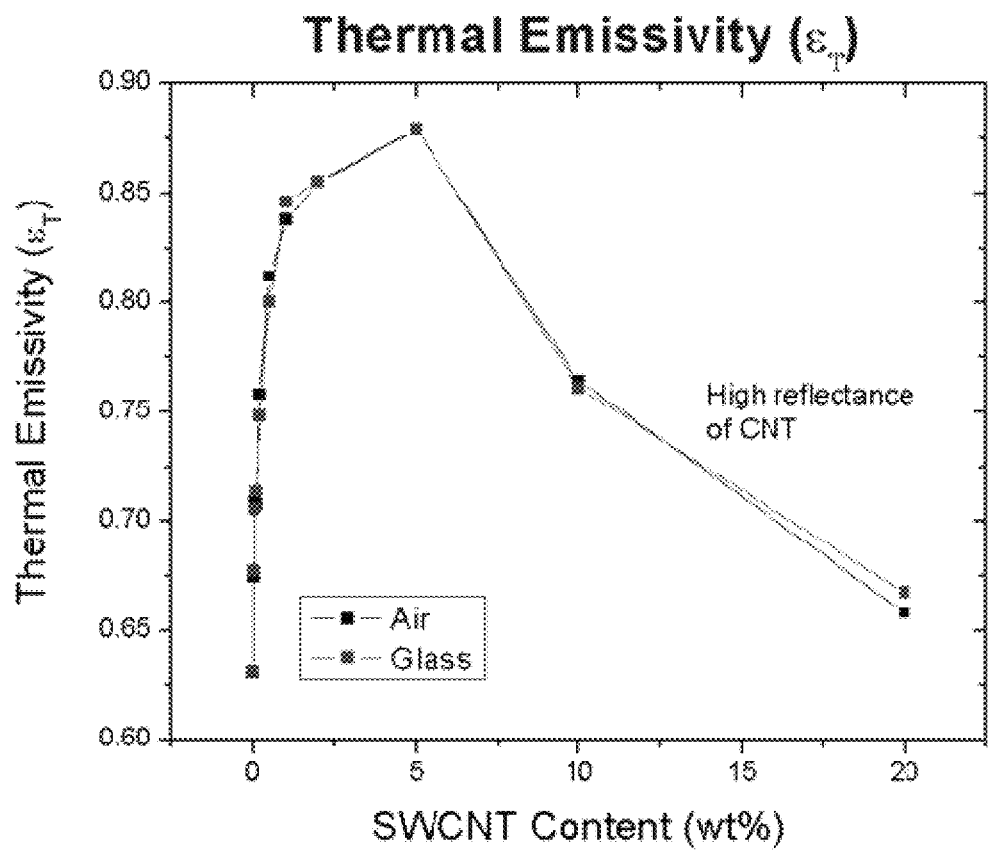
FIG. 10 illustrates a graph that shows the thermal emissivity as a function of the concentration of SWCNT in a polymer composite.

FIG. 10 illustrates a graph that shows the thermal emissivity of a polymer composite that includes single wall carbon nanotubes (SWCNT) and a polyimide. Specifically, FIG. 10 illustrates a graph that shows the thermal emissivity as a function of the concentration of SWCNT in a polymer composite. As shown in FIG. 10, the thermal emissivity of the polymer composite increases very rapidly with increasing SWCNT concentration up to five weight percent. Above that threshold, the thermal emissivity decreases with increasing SWCNT concentration. In some implementations, the decrease in the thermal emissivity seems to be caused by an increase in thermal reflectance while the thermal transmission decreased to nearly zero at two weight percent.

Figure 11:
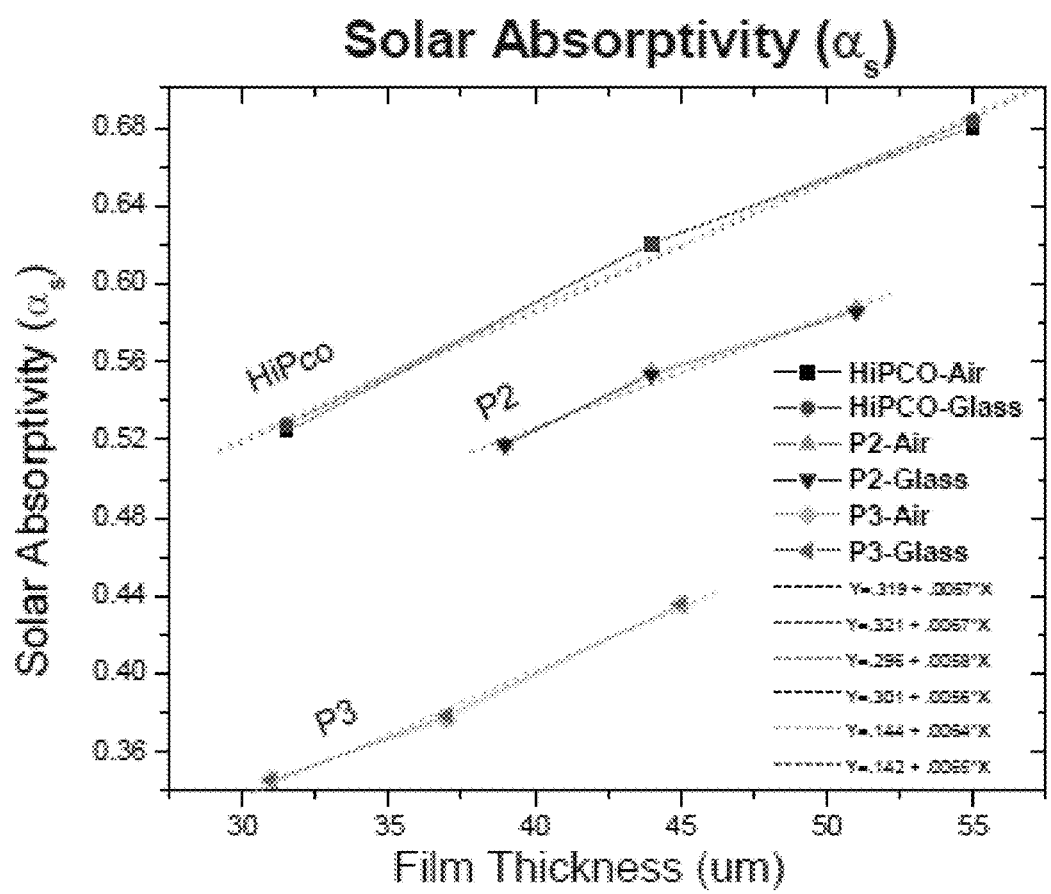
FIG. 11 illustrates a graph that shows the solar absorptivity as a function of the thickness of various polymer composites.

FIG. 11 illustrates a graph that shows the solar absorptivity as a function of the thickness of various polymer composites. As shown in FIG. 11, the solar absorptivity of the polymer composite increases with the thickness of the polymer composite.

Figure 12:
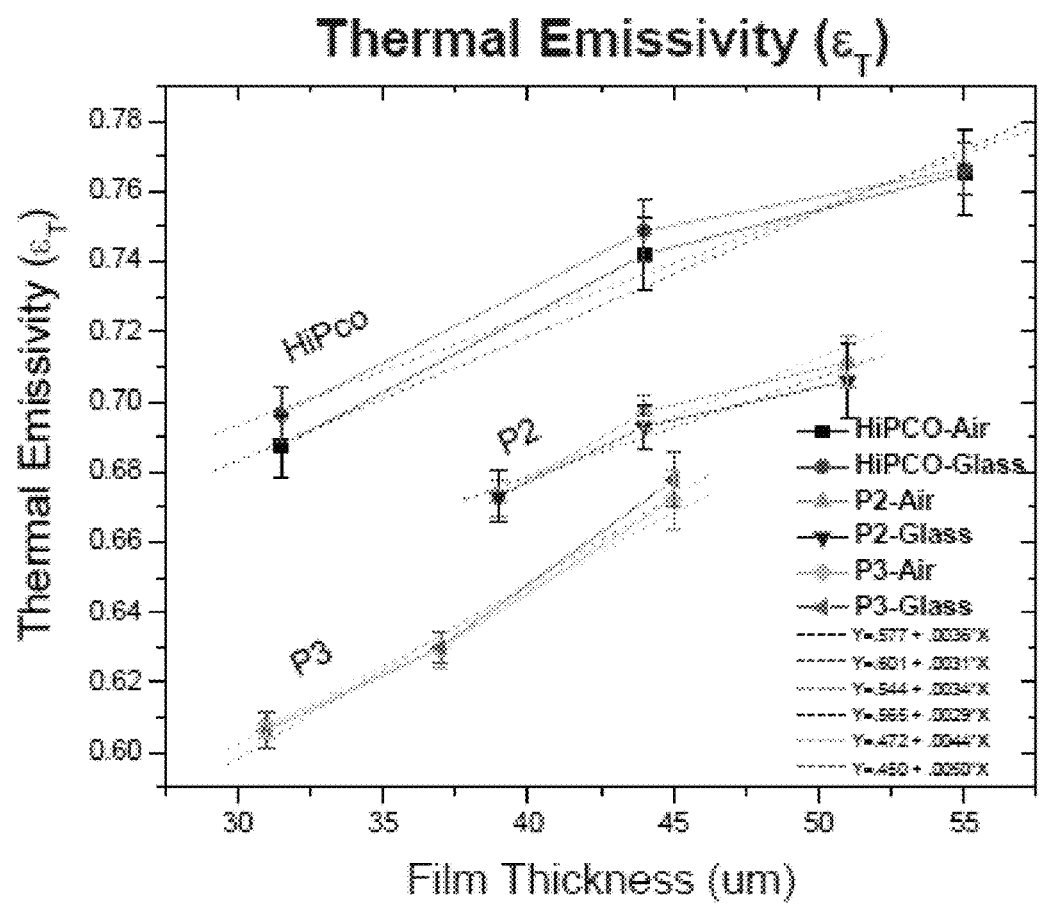
FIG. 12 illustrates a graph that shows the thermal emissivity as a function of the thickness of various polymer composites.

FIG. 12 illustrates a graph that shows the thermal emissivity as a function of the thickness of various polymer composites. As shown in FIG. 12, the thermal emissivity of the polymer composite increases with the thickness of the polymer composite.

Figure 13:
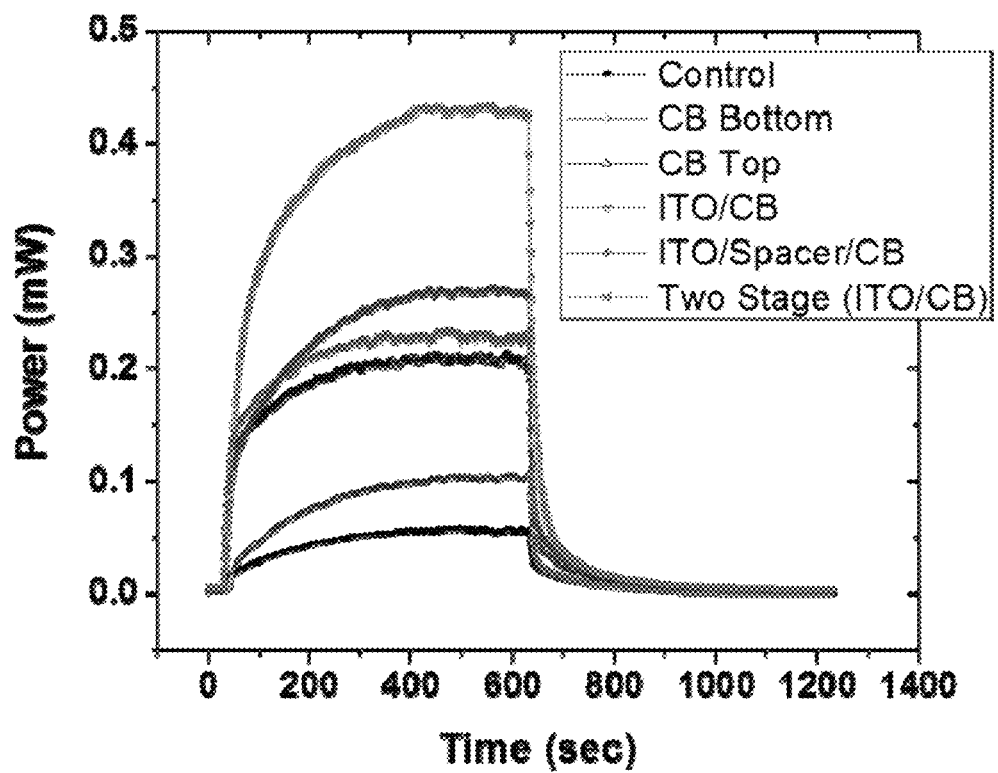
FIG. 13 illustrates a graph that shows the power generation of various solar devices utilizing different materials and/or coating on the solar absorption layer and/or cooling layer.

FIG. 13 illustrates a graph that shows actual power generation of different material coated solar devices (e.g., solar power cell and different structure). Specifically, FIG. 13 illustrates power generation from a base solar device (Control), a solar device where a cooling layer includes a polymer composite (CB Bottom), a solar device where a solar absorbance layer includes a polymer composite (CB Top), a solar device that includes two solar absorbance layers and a polymer composite (ITO/CB), a solar device that includes two solar absorbance layers, a polymer composite, and a spacing layer (ITO/Spacer/CB), and a solar device that includes several active layers, two solar absorbance layers, and a polymer composite (Two Stages/ITO/CB). It should be noted that the graph of FIG. 13 is merely exemplary of possible power generations of different solar devices.

As shown in FIG. 13, when a high thermal emissivity layer is coated on the bottom layer (e.g., cooling layer), an 80% power increase was obtained. As further shown in FIG. 13, by adding additional high solar absorptivity and low thermal emissivity coatings sequentially (e.g., in the solar absorbance layer(s)), the power generated by a solar device increased by 270% to 310%, accordingly. As further shown in FIG. 13, when a spacer (e.g., spacing layer) is inserted in the top solar absorbance layer, an additional 80% increase in power in the device was shown. In some implementations, when a device includes several stacked multistage power cell (e.g., active layers with several p-n junctions) with solar and thermal radiation control coating, a 700% increase in power was generated by the device.

It should be noted that the solar absorptivity and the thermal emissivity shown in FIGS. 9-13 are merely exemplary. In some implementations, a solar absorbance layer and/or cooling layer may have different solar absorptivity and/or different thermal emissivity.

Table 1 below illustrates the solar absorptivity and the thermal emissivity of various polymer composites (e.g., composite that includes Zn, Cu, CN, and/or carbon nanotubes) at various thicknesses and manufactured using different processes (e.g., cured at different temperatures). In some implementations, one or more of these polymer composites may be used in a solar absorption layer and/or cooling layer described in the present disclosure. As shown in Table 1, increasing the thickness of the polymer composite (e.g., polymer composite film) increases the solar absorptivity value of the polymer composite. Similarly, increasing the thickness of the polymer composite (e.g., polymer composite film) increases the thermal emissivity value of the polymer composite. It should be noted that Table 1 is merely an example of various polymer composites.

TABLE 1

| Sample Description | Thickness (um) | Film side | Solar Absorptivity ($\alpha_s$) | Thermal Emissivity ($\varepsilon_T$) | ($\alpha_s$)/($\varepsilon_T$) |
|---|---|---|---|---|---|
| ZnO—bCN AP PI, 400° C. | 10 | Air | 0.298 | 0.254 | 1.171 |
| | | Glass | 0.298 | 0.253 | 1.177 |
| SnOx—bCN AP PI, 300° C. | 17 | Up | 0.169 | 0.435 | 0.387 |
| | | Down | 0.165 | 0.431 | 0.382 |
| SnOx—bCN AP PI, 300° C. | 29 | Up | 0.244 | 0.555 | 0.439 |
| | | Down | 0.238 | 0.555 | 0.428 |
| SnOx—bCN AP PI, 300° C. | 40 | Up | 0.268 | 0.612 | 0.438 |
| | | Down | 0.258 | 0.594 | 0.434 |
| SnOx—bCN AP PI, 400° C. | 29 | Up | 0.509 | 0.608 | 0.837 |
| | | Down | 0.545 | 0.589 | 0.911 |
| CuOx—bCN AP PI, 300° C. | 37 | Up | 0.776 | 0.676 | 1.147 |
| | | Down | 0.766 | 0.681 | 1.125 |
| CuOx—bCN AP PI, 350° C. | 35 | Up | 0.810 | 0.671 | 1.206 |
| | | Down | 0.797 | 0.666 | 1.198 |
| CuOx—bCN AP PI, 400° C. | 35 | Up | 0.868 | 0.730 | 1.191 |
| | | Down | 0.834 | 0.732 | 1.140 |
| CuOx—bCN AP PI, 400° C. | 46 | Up | 0.885 | 0.777 | 1.140 |
| | | Down | 0.884 | 0.775 | 1.115 |

As shown in FIGS. 9-13 and Table 1, the infusion of carbon nanotubes and/or metal salts can be effectively used for tailoring solar absorptivity and thermal emissivity of polymeric materials (e.g., polymer composite materials). In some implementations, adding carbon nanotubes or metal salts, like iron (Fe) and copper (Cu) salts, increases the solar absorptivity and thermal emissivity, and adding zinc or indium salts decreases the thermal emissivity.

One advantage of using one or more of the above polymer composite for the solar absorption layer and/or the cooling layer is that it provides a solar device (e.g., solar panel, solar module) with enhanced mechanical properties. For example, in some implementations, the solar device that includes the polymer composite provides a flexible device (e.g., not brittle). A material and/or a device is brittle if, when subjected to stress, it breaks without significant deformation (strain). In some implementations, the solar device that includes the polymer composite is a flexible device (e.g., a device when subject to stress significantly deforms and/or bends before breaking). In some implementations, a flexible solar device is device that breaks under a relatively large amount of stress. In some implementations, a flexible device is a device that is ductile and/or malleable. In some implementations, a flexible device is a device that is stretchable.

Figure 14:
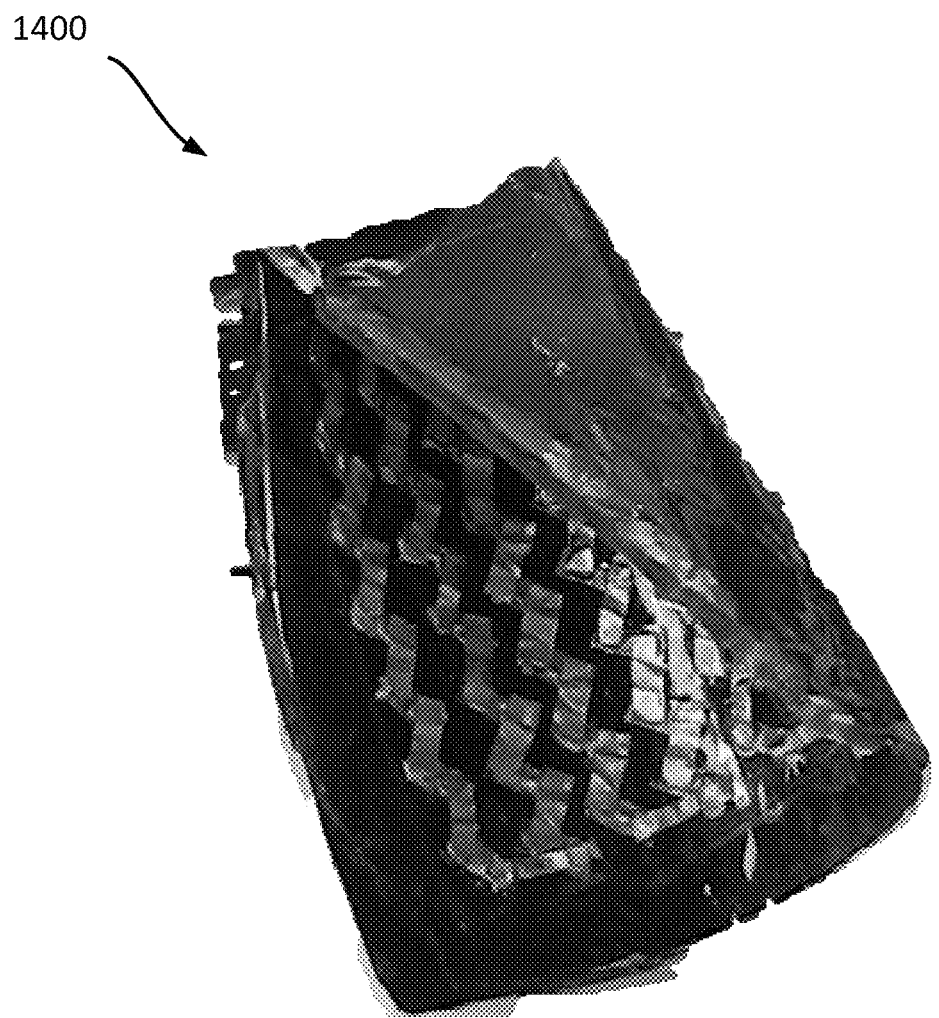
FIG. 14 illustrates a flexible solar device that is folded.

FIG. 14 illustrates flexible solar device that include a polymer composite. Specifically, FIG. 14 illustrates a flexible solar device 1400 that is folded. In some implementations, the flexible solar device 1400 includes a solar absorbance layer that includes a polymer composite. In some implementations, the flexible solar device 1400 includes a cooling layer that includes a polymer composite.

Exemplary Method for Providing a Solar Device

Figure 15:
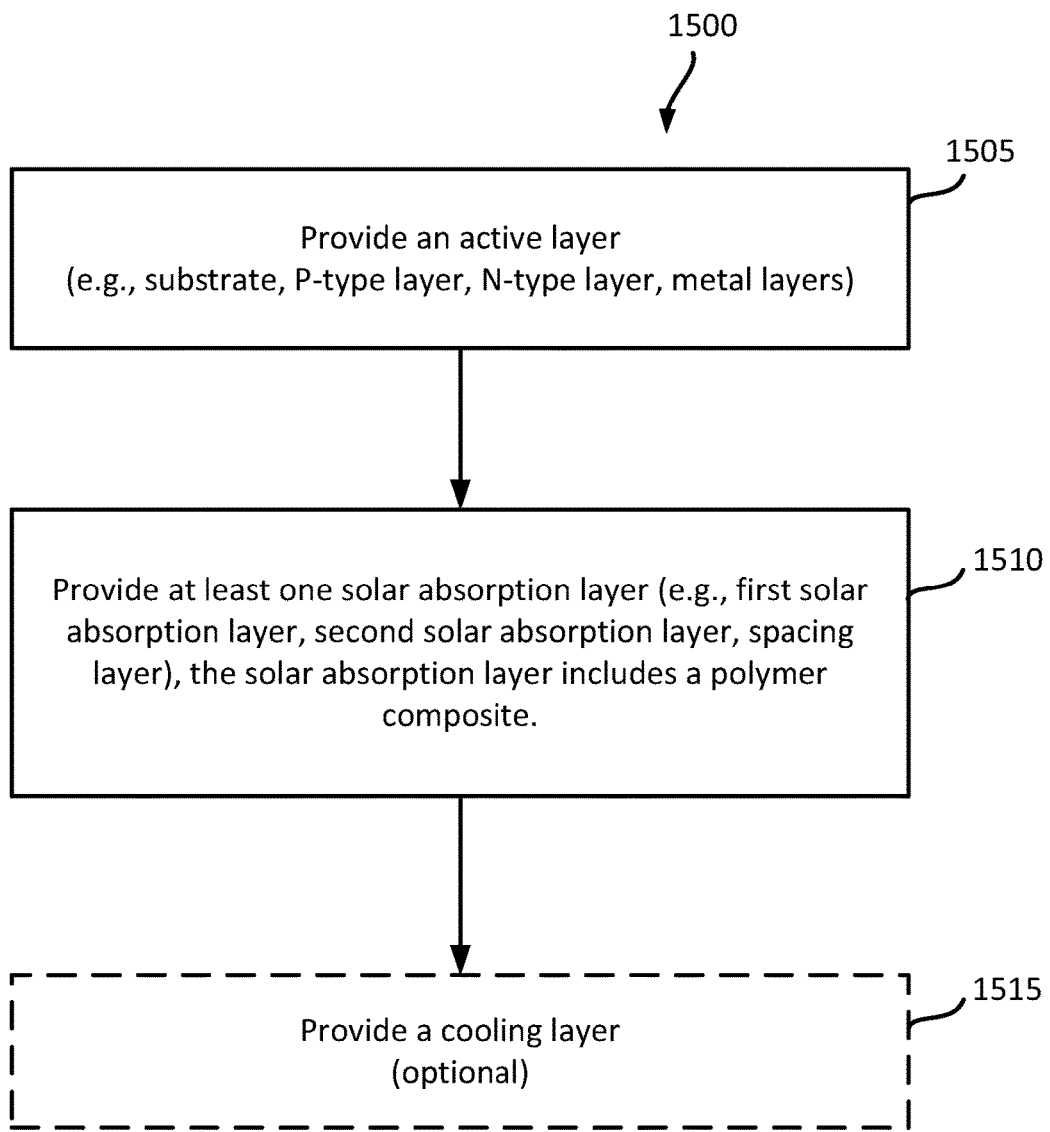
FIG. 15 illustrates a flow diagram of a method for providing a solar device.

FIG. 15 illustrates a flow diagram of a method for providing a solar device. In some implementations, the method of FIG. 15 may be used to provide/manufacture any of the solar devices described in the present disclosure.

As shown in FIG. 15, the method provides (at 1505) an active layer. In some implementations, the active layer includes a P-type layer, an N-type layer, a first metal layer and/or a second metal layer. In some implementations, the active layer is configured to provide the photovoltaic effect. In some implementations, the active layer is configured to provide the thermoelectric effect. In some implementations, the active layer is a semiconductor device (e.g., active device). The active layer may be a substrate that includes the P-type layer and the N-type layer. The P-type layer and the N-type layer may be configured to operate as a p-n junction. In some implementations, the active layer may include several P-type layers and several N-type layers. The first and second metal layers may be configured to operate as electrodes for the active layer.

The method then provides (at 1510) at least one solar absorbance layer. In some implementations, the solar absorbance layer includes a polymer composite. In some implementations, providing at least one solar absorbance layer includes providing a first solar absorbance layer and a second solar absorbance layer. In some implementations, providing at least one solar absorbance layer includes provides at least one spacing layer. In some implementations, the spacing layer is between the first solar absorbance layer and the second solar absorbance layer. In some implementations, the spacing layer is configured to allow air to remain between the first solar absorbance layer and the second solar absorbance layer. In some implementations, the first solar absorbance layer, the second absorbance layer, and/or the spacing layer is configured to improve, enhance and/or increase the energy harvesting capability (e.g., solar energy harvesting capability) of the active layer. In some implementations, improving, enhancing and/or increasing the energy harvesting capability of the active layer includes improving, enhancing and/or increasing the photovoltaic effect and/or thermoelectric effect of the active layer.

In some implementations, the first solar absorbance layer has a solar absorptivity ($\alpha_s$) value that is 0.9 or greater. In some implementations, the second solar absorbance layer has a thermal emissivity ($\varepsilon_T$) value that is 0.2 or less. In some implementations, the second solar absorbance layer has a solar absorptivity ($\alpha_s$) value that is 0.9 or greater. In some implementations, the first solar absorbance layer has a thermal emissivity ($\varepsilon_T$) value that is 0.2 or less.

In some implementations, a polymer composite may include one of at least ceramic, silicon, silicon oxide, metal salts ceramic salts, ceramic particles and/or carbon nanophase materials. In some implementations, a carbon nanophase material includes one of at least carbon nanotubes, carbon nanoplatelets, and/or carbon nanoparticles. In some implementations, the carbon nanotubes are single wall carbon nanotubes (SWCNT). Examples of metal salts include iron (Fe) salts and copper (Cu) salts. In some implementations, the polymer composite includes zinc (Zn) oxides and/or indium (In) oxides. The polymer composite may include a polymer film coated with zing oxides and/or indium oxides. In some implementations, the polymer film coated with zinc oxide may be provided by infusing zinc salts. In some implementations, the polymer film coated with indium oxide may be provided by infusing indium salts.

The method then optionally provides (at 1515) a cooling layer. In some implementations, the cooling layer includes a polymer composite. The cooling layer is coupled to a second surface of the active layer. In some implementations, the cooling layer is configured to provide passive cooling of the device and/or the active layer. Different implementations may use different materials for the cooling layer. In some implementations, the cooling layer includes several grooves. In some implementations, the grooves are configured to increase the surface area of the cooling layer. In some implementations, increase the surface area of the cooling layer increases, improves, and/or enhances the thermal emissivity (e.g., heat dissipation) of the cooling layer. In some implementations, the cooling layer includes carbon nanotubes (e.g., single wall carbon nanotubes (SWCNTs)). In such instances, the carbon nanotubes may be aligned in a particular direction of the cooling layer (e.g., carbon nanotubes aligned along surface of the cooling layer). In some implementations, the cooling layer has a thermal emissivity ($\varepsilon_T$) value that is 0.9 or greater.

Different implementations may provide/manufacture the polymer composite differently. An example of a method that may be used to manufacture the polymer composite of the present disclosure is described in U.S. Patent Application Publication 2011/0068291, titled "METALLIZED NANOTUBES POLYMER COMPOSITE (MNPC) AND METHODS FOR MAKING SAME", filed Nov. 26, 2008. U.S. Patent Application Publication 2011/0068291 claims priority to U.S. Provisional Application 61/004,520, filed Nov. 28, 2007. Both applications are herein incorporated by reference. In some implementations, both applications describe a method/process of using super critical fluid (SCF) infusion. In some implementations, the polymer composite may be provided by using in-situ metal (or CNT (carbon nanotubes)) infusion polymerization.

Exemplary Devices Comprising Solar Device

The solar device (e.g., devices 100, 200, 300, 400, 500, 600, 700, 800) described in the present application may be used in variety of applications and devices. In some implementations, the solar devices are lightweight, simple, flexible, easy to manufacture into versatile forms, and deployable over the existing ceramic based solar power panel. In some implementations, these solar devices may have applications that include, but are not limited to, (i) lightweight, durable, and deployable space-based solar power panel, which has great merits in launch cost and flexibility for wide applications; (ii) solar power panels in terrestrial applications (e.g., on aircraft wings, on engines, on building roofs, and etc.), (iii) power generation system utilizing unused waste thermal energy (e.g., building exteriors, hybrid green cars, and etc.), (iv) active/passive thermal control system, (v) active infared radio (IR) radar absorbing/reflecting control coating for a stealth technique, (vi) solar and thermal radiation coating for a greenhouse for cultivation for space or ground applications, (vii) solar and thermal radiation coating for a solar collector and concentrated solar power applications, and/or (viii) solar power panels for automobile applications One or more of the elements, steps, features, and/or functions illustrated in FIGS. 1, 2, 3, 4, 5, 6, 7, 8, and/or 14 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An energy harvesting device comprising:
    an active layer comprising both a first vertically positioned N-type layer and a first vertically positioned P-type layer within the active layer;
    a solar absorbance layer directly coupled to a first surface of the active layer, wherein the solar absorbance layer comprises a polymer composite and wherein the polymer composite includes one of at least metal oxide particles, ceramic salts, ceramic particles, and/or carbon nanophase materials; and
    a cooling layer coupled to a second surface of the active layer, wherein the cooling layer comprises one of at least ceramic oxides, metal oxides, and/or carbon nanophase materials, and
    wherein the cooling layer comprises a thermal emissivity ($\varepsilon_t$) value that is 0.9 or greater and the solar absorbance layer comprises a solar absorptivity ($\alpha_s$) value that is 0.9 or greater, the solar absorbance layer further comprising a thermal emissivity ($\varepsilon_t$) value that is 0.2 or less.

2. The device of claim 1, wherein the solar absorbance layer comprises a first solar absorbance layer and a second solar absorbance layer.

3. The device of claim 2, the first solar absorbance layer comprises a first thermal emissivity ($\varepsilon_t$) value that is 0.2 or less, the second solar absorbance layer comprises a first solar absorptivity ($\alpha_s$) value that is 0.9 or greater.

4. The device of claim 2, wherein at least a portion of the first and second solar absorbance layers is separated by a spacing layer.

5. The device of claim 4, wherein the spacing layer includes one of at least air and/or thermally insulating layer.

6. The device of claim 1, wherein the carbon nanophase material includes one of at least carbon nanotubes, carbon nanoplatelets, and/or carbon nanoparticies.

7. The device of claim 1, wherein the active layer further comprises a second N-type layer and a second P-type layer.

8. The device of claim 1, wherein the active layer further comprises:
a first metal layer counted to the first surface of the active layer; and
a second metal layer coupled to the second surface of the active layer.

9. The device of claim 1, wherein the active layer is configured to provide a photovoltaic effect.

10. The device of claim 1, wherein active layer is configured to provide a thermoelectric effect.

11. The device of claim 1, wherein the carbon nanophase material includes one of at least carbon nanotubes carbon nanoplatelets, and/or carbon nanoparticles.

12. The device of claim 1, wherein the cooling layer comprises a plurality of carbon nanotubes aligned in a particular direction of the cooling layer.

13. The device of claim 1, wherein the cooling layer comprises a set of grooves, and/or pillar structures, the set of rough configuration to increase a surface area of the cooling layer.

14. The device of claim 1, wherein the device is one of at least a solar panel, a solar module, an active thermal control system, and/or a passive thermal control system.

15. The device of claim 1, wherein the device is configured to be flexible.

16. An apparatus comprising:
an active layer comprising both a first N-type layer and a first P-type layer within the active layer;
a solar absorbance layer directly coupled to a first surface of the active layer, wherein the solar absorbance layer comprises a polymer composite and wherein the polymer composite includes one of at least metal oxide particles, ceramic salts, ceramic particles, and/or carbon nanophase materials; and
a cooling layer coupled to a second surface of the active layer, wherein the cooling layer comprises one of at lease ceramic oxides, metal oxides, and/or carbon nanophase materials, and
wherein the cooling layer comprises a thermal emissivity ($\varepsilon_t$) value that is 0.9 or greater and the solar absorbance means comprises a solar absorptivity ($\alpha_s$) value that is 0.9 or greater, the solar absorbance layer further comprising a thermal emissivity ($\varepsilon_t$) value that is 0.2 or less.

17. The apparatus of claim 16, wherein the solar absorbance layer comprises a first solar absorbance layer and a second solar absorbance layer.

18. The apparatus of claim 17, the first solar absorbance layer comprises e first thermal emissivity ($\varepsilon_t$) value that is 0.2 or less, the second solar absorbance layer comprises a first solar absorptivity ($\alpha_s$) value that is 0.9 or greater.

19. The apparatus of claim 17, wherein at least a portion of the first and second solar absorbance layer is separated by a spacing layer.

20. The apparatus of claim 19, wherein the spacing layer includes one of at least air and/or thermally insulating layer.

21. The apparatus of claim 16, wherein the carbon nanophase material of the active layer includes one of least carbon nanotubes, carbon nanoplatelets, and/or carbon nanoparticles.

22. The apparatus of claim 16, wherein the active layer further comprises a second N-type layer and a second P-type layer.

23. The apparatus of claim 16, wherein the active layer further comprises:
a first metal layer coupled to the first surface of the active layer; and
a second metal layer coupled to the second surface of the active layer.

24. The apparatus of claim 16, wherein the active layer is configured to provide a photovoltaic effect.

25. The apparatus of claim 16, wherein the active layer is configured to provide a thermoelectric effect.

26. The apparatus of claim 16, wherein the carbon nanophase material of the cooling layer includes one of at least carbon nanotubes, carbon nanoplatelets, and/or carbon nanoparticles.

27. The apparatus of claim 16, wherein the cooling layer comprises a plurality of carbon nanotubes aligned in a particular direction of the cooling means.

28. The apparatus of claim 16, wherein the cooling layer comprises a set of groove, the set of grooves configured to increase a surface area of the cooling layer.

29. The apparatus of claim 16, wherein the apparatus is one of at least a solar panel, a solar module, an active thermal control system, and/or a passive thermal control system.

30. The apparatus of claim 16, wherein the apparatus is configured to be flexible.

* * * * *